(12) United States Patent
Ide

(10) Patent No.: US 12,222,373 B2
(45) Date of Patent: Feb. 11, 2025

(54) MAGNETIC SENSOR AND CURRENT SENSOR

(71) Applicant: Alps Alpine Co., Ltd., Tokyo (JP)

(72) Inventor: Yosuke Ide, Niigata-ken (JP)

(73) Assignee: Alps Alpine Co., Ltd., Tokyo (JP)

( * ) Notice: Subject to any disclaimer, the term of this patent is extended or adjusted under 35 U.S.C. 154(b) by 123 days.

(21) Appl. No.: 18/158,266

(22) Filed: Jan. 23, 2023

(65) Prior Publication Data

US 2023/0160928 A1 May 25, 2023

Related U.S. Application Data

(63) Continuation of application No. PCT/JP2021/026150, filed on Jul. 12, 2021.

(30) Foreign Application Priority Data

Aug. 12, 2020 (JP) ................................. 2020-136314

(51) Int. Cl.
*G01R 15/20* (2006.01)
*G01R 19/00* (2006.01)
*G01R 33/09* (2006.01)

(52) U.S. Cl.
CPC ....... *G01R 15/205* (2013.01); *G01R 19/0092* (2013.01); *G01R 33/093* (2013.01)

(58) Field of Classification Search
CPC . G01R 15/205; G01R 33/093; G01R 19/0092
See application file for complete search history.

(56) References Cited

U.S. PATENT DOCUMENTS

| 8,487,612 | B2 | 7/2013 | Ichinohe et al. |
| 2015/0097560 | A1 | 4/2015 | Kawakami et al. |
| 2018/0356448 | A1* | 12/2018 | Saito .................... G01R 15/205 |

(Continued)

FOREIGN PATENT DOCUMENTS

| JP | 2013/161773 | 10/2013 |
| JP | 2014/66589 | 4/2014 |
| JP | 2019-002742 | 1/2019 |

(Continued)

OTHER PUBLICATIONS

International Search Report from International Application No. PCT/JP2021/026150 dated Aug. 31, 2021.

*Primary Examiner* — Minh Q Phan
(74) *Attorney, Agent, or Firm* — Beyer Law Group LLP

(57) ABSTRACT

A magnetic sensor includes a magnetoresistive element having a sensitivity axis in a Y direction, a magnetic shield disposed apart in a Z direction from the magnetoresistive element and configured to attenuate the intensity of a magnetic field to be measured, and a magnetic balance coil. The magnetic shield includes a first shield part longitudinally extending in the X direction and second shield parts provided on either side of the first shield part. The first shield part has a portion that overlaps the magnetoresistive element when viewed in the Z direction. Each second shield part has a portion that overlaps the magnetoresistive element when viewed in the X direction. A magnetic path for a magnetic field in the X direction can be formed from one of the second shield parts to the other one of the second shield parts via the first shield part.

7 Claims, 21 Drawing Sheets

(56) References Cited

U.S. PATENT DOCUMENTS

2022/0187344 A1\* 6/2022 Saito .................. G01R 15/205

FOREIGN PATENT DOCUMENTS

| JP | 2019-138807 | 8/2019 |
| WO | 2011/111493 | 9/2011 |
| WO | 2016/203781 | 12/2016 |
| WO | WO-2016203781 A1 \* | 12/2016 |

\* cited by examiner

MAGNETIC SENSOR AND CURRENT SENSOR

CLAIM OF PRIORITY

This application is a Continuation of International Application No. PCT/JP2021/026150 filed on Jul. 12, 2021, which claims benefit of Japanese Patent Application No. 2020-136314 filed on Aug. 12, 2020. The entire contents of each application noted above are hereby incorporated by reference.

BACKGROUND OF THE INVENTION

1. Field of the Invention

The present invention relates to a magnetic sensor and a current sensor including a magnetic sensor.

2. Description of the Related Art

Relatively large currents are used in fields of motor drive technology for electric vehicles, hybrid cars, and the like, and in infrastructure-related fields such as pole transformers. In these fields, there is a demand for a current sensor capable of measuring a large current without contact. For the above purpose, it is known to use a magnetic sensor configured to detect an induced magnetic field generated by a current to be measured. For example, a magnetoresistive element such as a GMR (Giant MagnetoResistive) element is used as the magnetic detection element in the magnetic sensor.

Although the magnetoresistive element has high detection sensitivity, high-linearity detection is allowed only in a relatively narrow range of magnetic field intensity. To handle the above situation, as with a current sensor shown in FIG. 3 in International Publication No. 2011/111493, it is known to use a method in which a magnetic shield is disposed between a current to be measured and a magnetoresistive element, and an induced magnetic field attenuated by the magnetic shield is applied to the magnetoresistive element. This makes it possible to convert the strength of the induced magnetic field to a value within a range in which the magnetoresistive element has a good detection characteristic and apply the resultant induced magnetic field to the magnetoresistive element. By reducing, using the magnetic shield, the strength of the magnetic field substantially applied to the magnetoresistive element in the above-described manner, it is possible to expand the detectable range of the magnetic field strength.

The effect of reducing the magnetic field strength becomes greater as the distance between the magnetoresistive element and the magnetic shield is reduced. However, when the applied magnetic field is as strong as several tens of mT, the strong magnetic field often causes residual magnetization to occur even when the magnetic shield is made of a soft magnetic material. When a magnetic field caused by the residual magnetization of the magnetic shield is applied to the magnetoresistive element, the zero-magnetic field hysteresis of the magnetoresistive element increases in the negative direction, which can adversely affect the measurement accuracy of the magnetoresistive element. When a strong magnetic field is applied to the magnetic shield, the magnetic shield becomes magnetically saturated. As a result, the magnetic field shielding effect weakens and a strong magnetic field is applied to the magnetoresistive element. This causes an increase in the hysteresis of the free magnetic layer, which can cause the resistance of the magnetoresistive element to deviate from an assumed value.

In view of the above, Japanese Unexamined Patent Application Publication No. 2019-138807 discloses a magnetic sensor including a magnetic shield having a main body and a magnetic absorption portion. This magnetic sensor can reduce an influence of residual magnetization of the magnetic shield applied in a direction parallel to the sensitivity axis of the magnetoresistive element, and can have a high tolerance of the magnetoresistive element to a perpendicular magnetic field applied in a direction perpendicular to the sensitivity axis.

Although the tolerance of magnetic sensors to perpendicular magnetic fields is improved by optimizing the shape, as with the magnetic shield disclosed in Japanese Unexamined Patent Application Publication No. 2019-138807, magnetic sensors with even higher tolerance to perpendicular magnetic fields are desired in fields where large currents are used.

SUMMARY OF THE INVENTION

The present invention provides a magnetic sensor having a high tolerance to a perpendicular magnetic field. The present invention also provides a current sensor including such a magnetic sensor.

In an aspect, the present invention provides a magnetic sensor configured to measure a strength of a measurement-target magnetic field, the magnetic sensor including a magnetoresistive element formed in an element formation plane and having a sensitivity axis extending in an in-plane direction in the element formation plane, a magnetic shield disposed apart from the magnetoresistive element in a thickness direction perpendicular to the element formation plane and configured to attenuate the strength of the measurement-target magnetic field applied to the magnetoresistive element, and a magnetic balance coil disposed between the magnetoresistive element and the magnetic shield, whereby the strength of the measurement-target magnetic field is measured based on a current flowing through the magnetic balance coil, wherein the magnetic shield includes a first shield part whose longitudinal direction extends in an in-plane perpendicular direction perpendicular to the sensitivity axis in an in-plane direction of the element formation plane, and second shield parts provided on either side in a longitudinal direction of the first shield part, the first shield part has a portion overlapping the magnetoresistive element when viewed in the thickness direction, the second shield parts each have a portion overlapping the magnetoresistive element when viewed in the in-plane perpendicular direction, and a magnetic path for a magnetic field in the in-plane perpendicular direction can be formed from one of the second shield parts to the other one of the second shield parts via the first shield part.

By providing the second shield parts having portions overlapping the magnetoresistive element when viewed in the in-plane perpendicular direction perpendicular to the sensitivity axis thereby forming the bypass magnetic path from one of the second shield parts to the other one of the second shield parts via the first shield part, it is possible to effectively attenuate the perpendicular magnetic field.

The first shield part and the second shield part may be magnetically connected to each other via a gap. In this case, the distance between the first shield part and the second shield part is preferably 20 μm or less.

The gap provided between the first shield part and the second shield part can suppress an adverse influence of the second shield part on the enhancement effect of a magnetic balance coil by the first shield part. Furthermore, setting the gap distance to 20 µm or less makes it possible to magnetically coupling the first shield part and the second shield part such that a magnetic path is formed from one of the second shield parts to the other one of the second shield parts via the first shield part, thereby allowing the perpendicular magnetic field to bypass the magnetoresistive element.

The magnetic balance coil may include a parallel portion and a crossing portion, the parallel portion extending parallel to the in-plane perpendicular direction, the crossing portion extending in a direction crossing the in-plane perpendicular direction, when viewed in the thickness direction, and the first shield part may overlap the parallel portion and the magnetoresistive element but may not overlap the crossing portion when viewed in the thickness direction.

This configuration makes it possible for the first shield part to enhance only the magnetic field applied from the parallel portion to the magnetoresistive elements without being affected by the magnetic field from the crossing portion.

The magnetic balance coil may include a first coil and a second coil, the first coil and the second coil may be disposed symmetrically with respect to a line passing through the magnetoresistive element when viewed in the thickness direction, each of the first coil and the second coil may include a parallel portion and a crossing portion, the parallel portion extending parallel to the in-plane perpendicular direction, the crossing portion extending in a direction crossing the in-plane perpendicular direction, when viewed in the thickness direction, the first shield part may overlap, when viewed in the thickness direction, an adjacent portion including the parallel portions respectively of the first coil and the second coil adjacent to each other and may overlap the magnetoresistive element but may not overlap the crossing portion, and the second shield part may be disposed, when viewed in the thickness direction, between the crossing portion of the first coil and the crossing portion of the second coil.

A plurality of magnetoresistive elements may be provided, and the plurality of magnetoresistive elements may be arranged in the in-plane perpendicular direction, and the first coil and the second coil may be disposed, when viewed in the thickness direction, symmetrically with respect to a line passing through the plurality of magnetoresistive elements.

By providing the magnetic balance coil including the first coil and the second coil arranged line-symmetrically when viewed in the thickness direction and providing the second shield part between the crossing portions continuous to the adjacent portion, it becomes possible to dispose the second shield part so as not to overlap the crossing portion of the magnetic balance coil. This makes it possible to greatly prevents the first shield part covering the adjacent portion from being affected by the magnetic field from the crossing portion via the second shield part magnetically coupled only at the end portion with the first shield part. Thus, the first shield part can enhance only the magnetic field applied to the magnetoresistive element from the adjacent portion substantially without being affected by the magnetic field from the crossing portion.

The first shield part and the second shield part may be connected to each other. This makes it possible for the magnetic shield to easily form the magnetic path and thus it becomes possible to efficiently attenuate the perpendicular magnetic field from the in-plane perpendicular direction.

The second shield part may have a connection end connected to the first shield part and a non-connection end opposite to the connection end, and, when viewed in the thickness direction, the distance between the magnetoresistive element and the non-connection end may be greater than the distance between the magnetoresistive element and the connection end.

This configuration makes it possible to absorb the perpendicular magnetic field from one non-connection end of the second shield part thereby attenuating the perpendicular magnetic field.

According to another aspect, the present invention provides a current sensor including the magnetic sensor described above, wherein the measurement-target magnetic field measured by the magnetic sensor is an induced magnetic field generated by a current to be measured.

The present invention can provide the magnetic sensor that is hardly affected by the perpendicular magnetic field applied to the magnetoresistive element and can perform the measurement substantially without a reduction in measurement accuracy due to the influence of the external magnetic field. The present invention also provide the current sensor using such a magnetic sensor.

BRIEF DESCRIPTION OF THE DRAWING

FIG. 2A illustrates a magnetoresistive element, FIG. 2B illustrates a magnetic balance coil, and FIG. 2C illustrates a magnetic shield;

DESCRIPTION OF THE PREFERRED EMBODIMENTS

First Embodiment

In a magnetic sensor using a magnetoresistive element, when a magnetic field is applied in a direction perpendicular to a sensitivity axis, a free magnetic layer transits into a multi-magnetic-domain state, which causes an increase in the hysteresis. To suppress the transition of the free magnetic layer into the multi-magnetic-domain state, it is known to provide an antiferromagnetic layer made of IrMn or the like laminated adjacent to the free magnetic layer and apply an exchange bias magnetic field. However, even in this structure, when the free magnetic layer is reversed into the direction opposite to the initial magnetization direction and then the magnetic field becomes zero, although the magnetization of the free magnetic layer returns to the initial direction, an offset occurs due to hysteresis.

In the magnetic sensor, to suppress the offset by attenuation of the perpendicular magnetic field, it is known to provide a magnetic shield on the magnetoresistive element. By using this structure, it is possible to shift the value of the magnetic field strength at which the offset occurs to a higher value thereby allowing the magnetic sensor to have a higher tolerance to the perpendicular magnetic field. Use of the magnetic shield with a good shielding effect makes it possible for the magnetic sensor to have an excellent tolerance to the perpendicular magnetic field.

A description is given below as to an offset that occurs in a free magnetic layer in a GMR (Giant MagnetoResistive) element used as a magnetoresistive element of a current sensor or a magnetic sensor.

Figure 20:
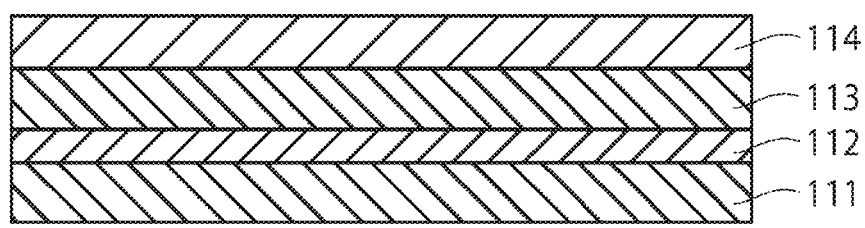
FIG. 20 is a cross-sectional view schematically illustrating a multilayer structure of a GMR element.
Figure 20:
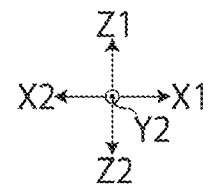

FIG. 20 is a cross-sectional view schematically illustrating a multilayer structure of a GMR element 110. The GMR element 110 includes a fixed magnetic layer 111, a non-magnetic material layer 112, and a free magnetic layer 113, which are formed in a multilayer structure. The resistance of the GMR element 110 changes depending on the relative relationship between the magnetization direction of the fixed magnetic layer 111 whose magnetization direction is fixed and the magnetization direction of the free magnetic layer 113 whose magnetization direction changes depending on an external magnetic field. The magnetic sensor can detect the direction and the strength of the external magnetic field based on the change in resistance.

When domain walls in the free magnetic layer 113 move, Barkhausen noise occurs. In view of this, to provide a bias magnetic field for stabilizing the output of the magnetic sensor including the GMR element 110, an exchange bias magnetic field using an exchange coupling magnetic field with the antiferromagnetic layer 114 is applied in a direction perpendicular to the sensitivity axis. By applying the bias magnetic field, the magnetization directions of the soft magnetic material forming the free magnetic layer 113 can be aligned. The bias magnetic field is not limited to the exchange bias magnetic field. For example, a hard bias magnetic field using a permanent magnet may be used as the bias magnetic field.

In a case where the applied external magnetic field is weak enough not to cause the magnetization direction to be reversed, when the magnetic field is returned to zero, the free magnetic layer 113 returns to the initial state, that is, the state of the free magnetic layer 113 before the external magnetic field is applied. However, in a case where the applied external magnetic field is strong and the magnetization direction is reversed, even if the magnetic field is returned to zero, the free magnetic layer 113 does not return to the initial state. That is, when the magnetization direction of the free magnetic layer 113 is reversed by a strong external magnetic field, even if the external magnetic field is removed and the external magnetic field returns to zero, a deviation (offset) from the initial state occurs due to the hysteresis of the free magnetic layer 113.

Figure 21:
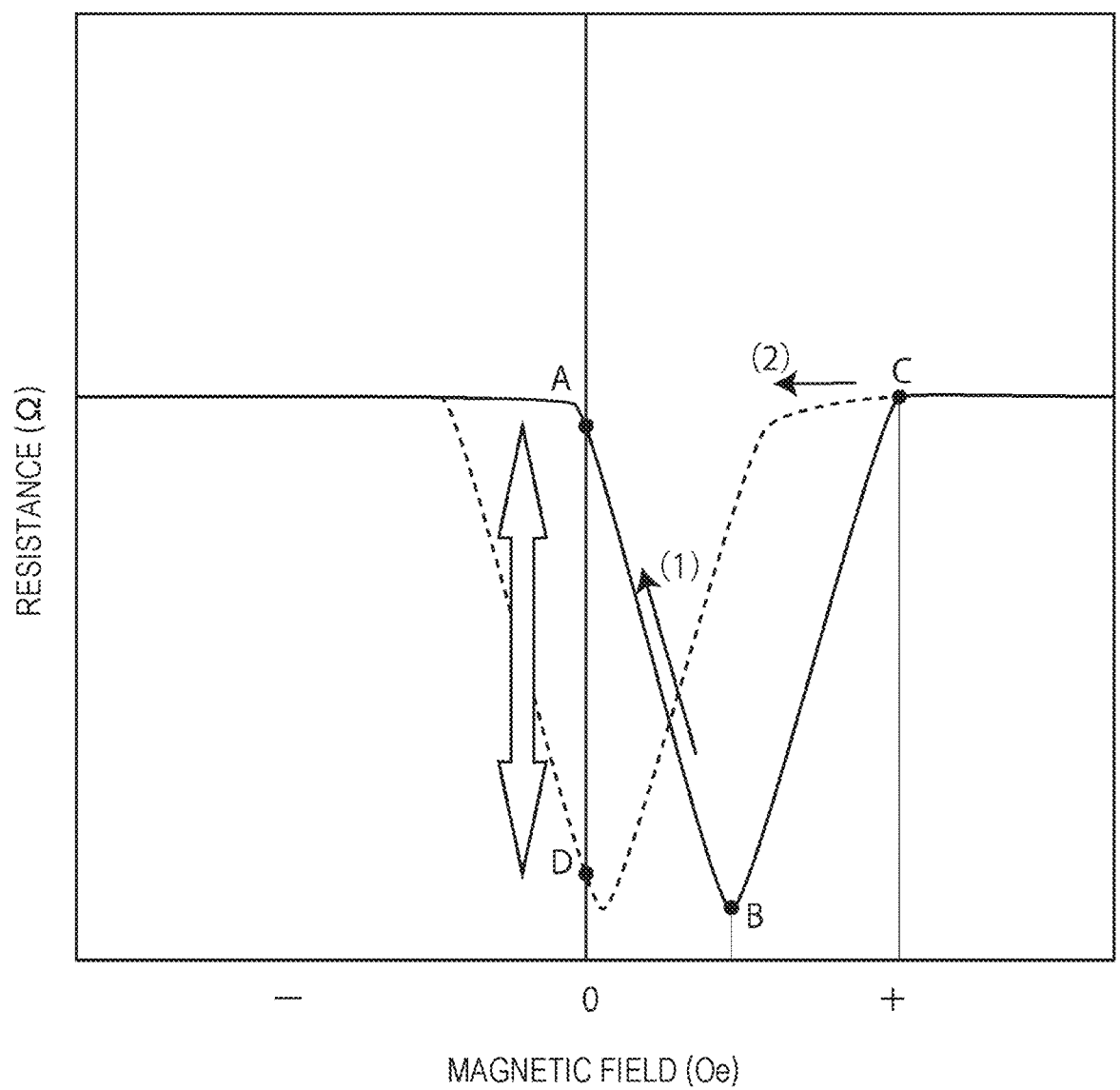
FIG. 21 is a diagram illustrating an offset of a resistance of a free magnetic layer caused by hysteresis.

FIG. 21 is a diagram illustrating an occurrence of an offset of a resistance caused by the hysteresis of the free magnetic layer. As shown in FIG. 21, in a case where the external magnetic field (the perpendicular magnetic field) applied to the free magnetic layer in the direction perpendicular to the sensitivity axis is smaller than a reversing magnetic field B, when the external magnetic field is returned to zero, the state of the free magnetic layer changes along a solid line in a direction denoted by an arrow (1) and returns to the initial state. Therefore, if the magnitude of the external magnetic field is within a range from 0 to the reversing magnetic field B, when the external magnetic field is returned to zero, the resistance of the free magnetic layer returns to an initial value of A.

However, in a case where the applied external magnetic field is equal to or greater than the reversing magnetic field B, even when the external magnetic field returns to zero, the free magnetic layer does not return to the initial state. For example, when a saturation magnetic field C is applied to the free magnetic layer, the hysteresis of the free magnetic layer causes the resistance to change as indicated by a broken line. Therefore, when the external magnetic field becomes zero, the resistance of the free magnetic layer changes along the broken line in a direction denoted by an arrow (2) and the resistance of the free magnetic layer becomes D. As described above, when the magnitude of the external magnetic field is equal to or greater than the reversing magnetic field B, the hysteresis of the free magnetic layer causes the resistance of the free magnetic layer to deviate from its initial value.

As described above, when an external magnetic field larger than the reversing magnetic field B is applied and thus the magnetization direction of the free magnetic layer is reversed from the initial magnetization direction, an offset of the resistance of the free magnetic layer occurs after the external magnetic field becomes zero. The offset that occurs in the resistance of the free magnetic layer varies depending on the magnitude of the external magnetic field within a range indicated by an open arrow in FIG. 21. The change in the resistance of the free magnetic layer can cause a reduction in detection accuracy, and thus it is preferable that the magnetic sensor has a high tolerance to the external magnetic field.

In view of the above, to improve the detection accuracy of the magnetic sensor, a magnetic shield is used to attenuate the external magnetic field. The external magnetic field attenuated by the magnetic shield is applied to the magnetoresistive element 11. Therefore, the reversing magnetic field B shifts to a higher value of the magnetic field, and this results in an expansion of the range in which the magnetic sensor has high detection accuracy.

From the viewpoint of attenuating the external magnetic field, it is preferable that the magnetic shield is provided at a location near the magnetoresistive element. However, when the magnetic shield is provided near the magnetoresistive element, the effect of the return magnetic field due to the residual magnetization of the magnetic shield increases. This can be one of the causes of deterioration in detection accuracy of the magnetic sensor. Therefore, in conventional magnetic sensors, a magnetic shield is generally provided at a position away from the magnetoresistive element.

Figure 1A:
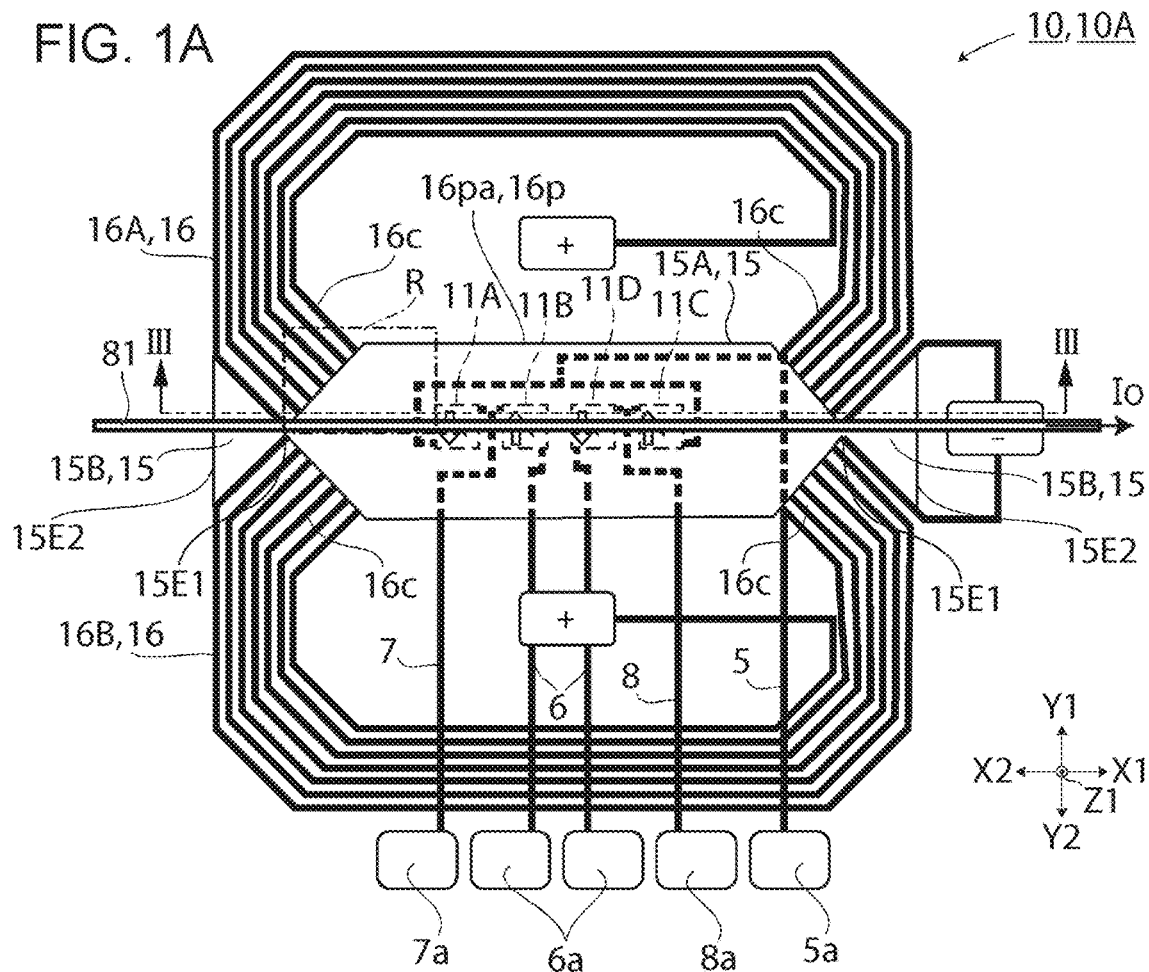
FIG. 1A is a plan view schematically illustrating a structure of a magnetic sensor according to a first embodiment.
Figure 1B:
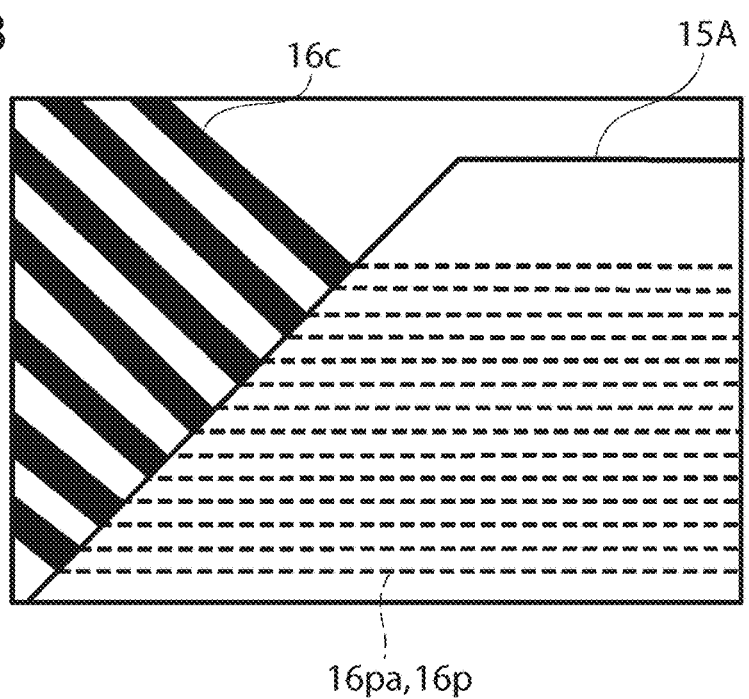
FIG. 1B is an enlarged view of a portion surrounded by a rectangle in FIG. 1A.

FIG. 1A is a plan view schematically illustrating a structure of a magnetic sensor according to the present embodiment. FIG. 1B is an enlarged view of a portion R surrounded by a rectangle in FIG. 1A. In FIG. 1A, for convenience of illustration, magnetoresistive elements 11A to 11D located below a magnetic shield 15 (on a Z2 side of a Z1-to-Z2 direction, see FIG. 3) are indicated by broken lines, and a magnetic balance coil 16 is not shown. Similarly, in other figures of magnetic sensors, the magnetic balance coil 16 is not shown. In FIG. 1B, the magnetic balance coil 16 located below the magnetic shield 15 is indicated by a broken line.

Figure 2A:
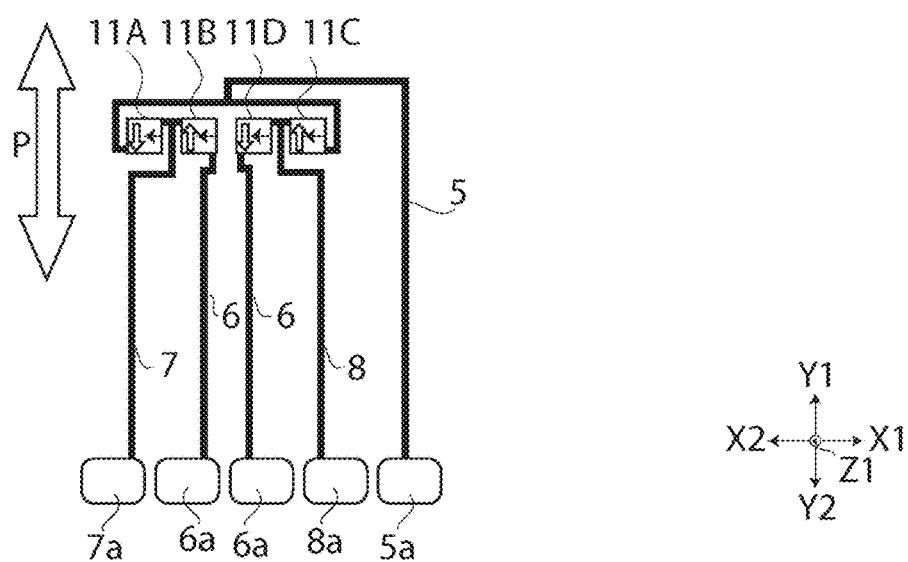
FIGS. 2A to 2C are plan views illustrating, in an exploded manner, members constituting a magnetic sensor, and more specifically
Figure 2B:
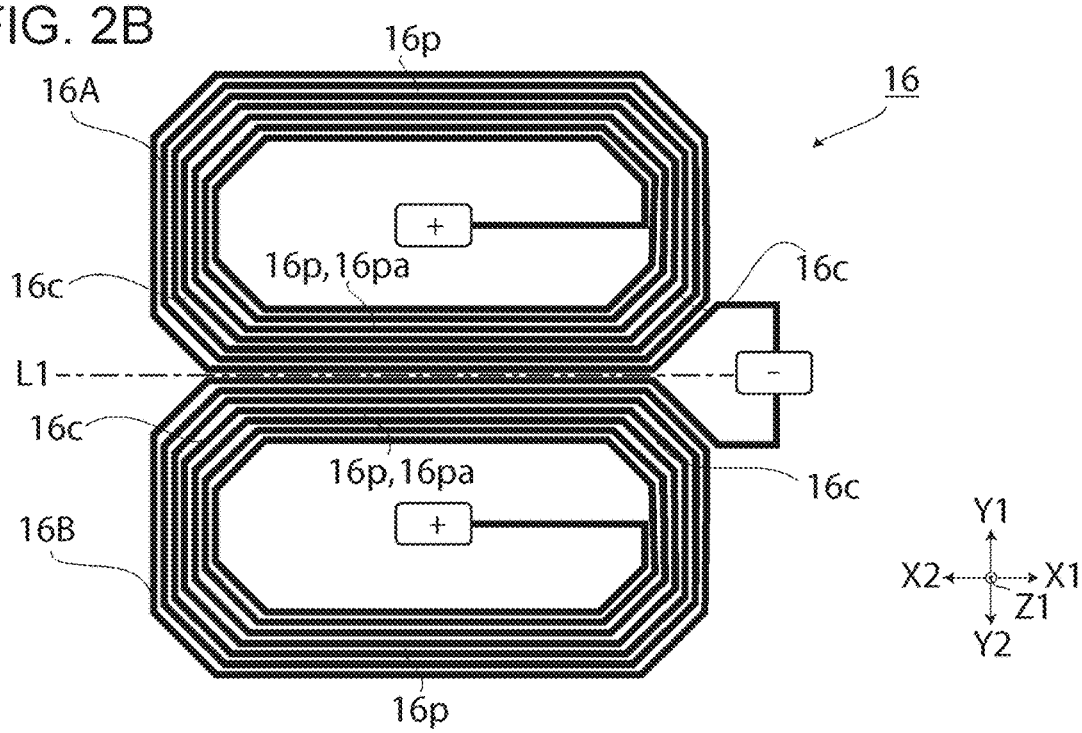
Figure 2C:
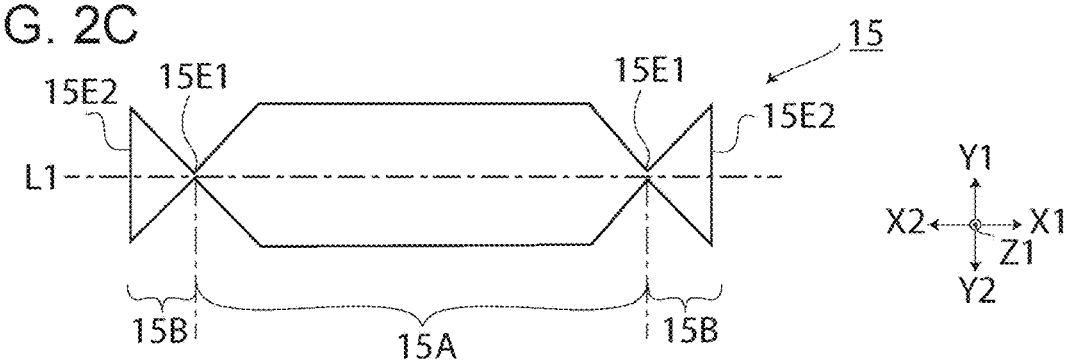

FIGS. 2A to 2C are plan views illustrating, in an exploded manner, members constituting the magnetic sensor 10 shown in FIG. 1A, wherein FIG. 2A illustrates magnetoresistive elements, FIG. 2B illustrates a magnetic balance coil, and FIG. 2C illustrates a magnetic shield.

As shown in FIGS. 2A to 2C and FIG. 3, the magnetic sensor 10 includes four magnetoresistive elements 11A to 11D (when they are not distinguished, they are referred to as magnetoresistive elements 11) formed in an element formation plane (an XY plane) and each having a sensitivity axis extending in an in-plane direction (an Y1-Y2 direction (also referred to as a Y direction)) in the element formation plane, the magnetic shield 15 that is for attenuating the strength of a magnetic field to be measured (hereafter also referred to as a measurement-target magnetic field) applied to the magnetoresistive elements 11 and that is disposed apart from the magnetoresistive elements 11 in a thickness direction (a Z1-Z2 direction (also referred to as a Z direction)) perpendicular to the element formation plane, and the magnetic balance coil 16, which are all formed on the same chip. The magnetic sensor 10 measures the strength of the measurement-target magnetic field based on a current flowing through the magnetic balance coil 16.

Figure 3:
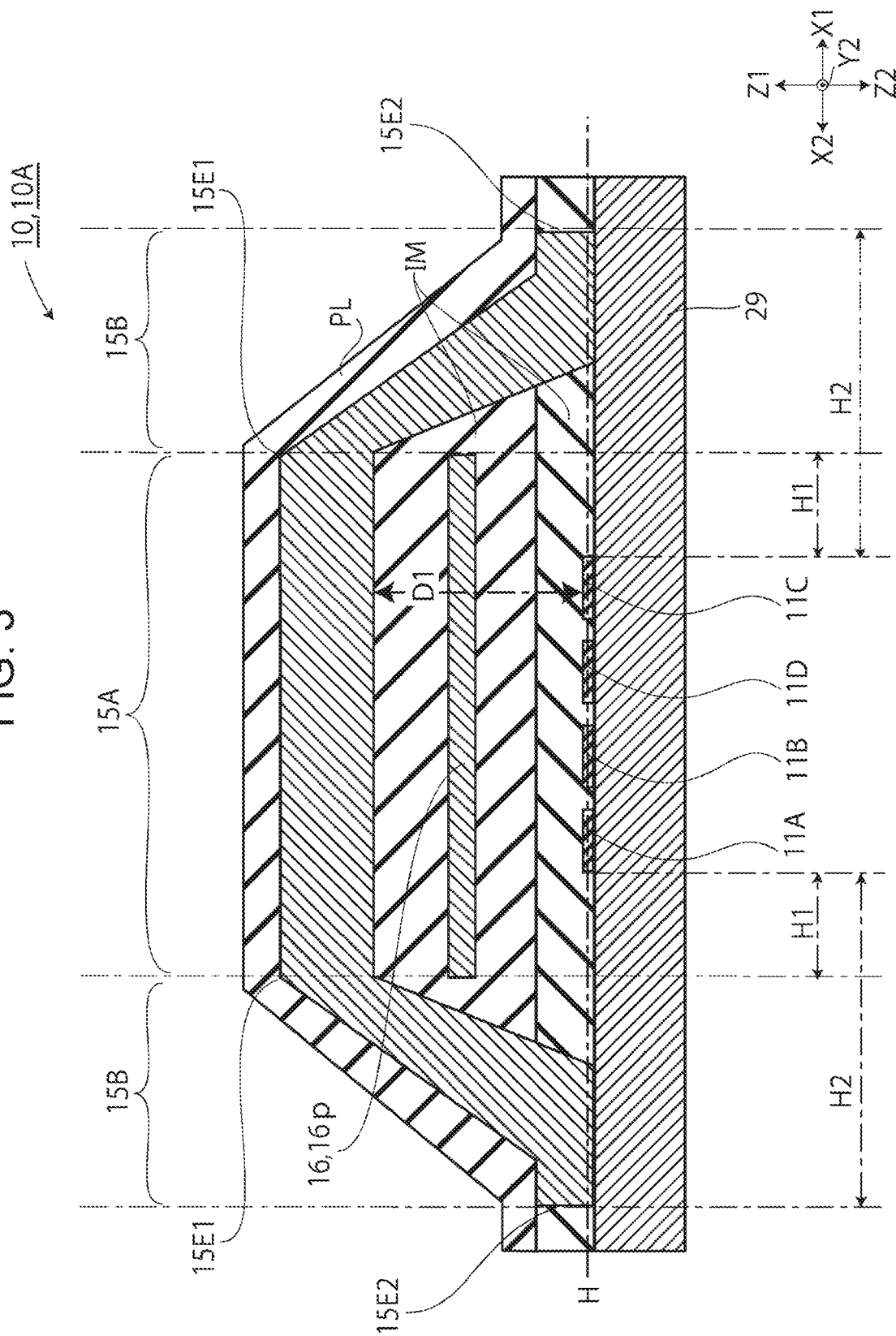
FIG. 3 is a cross-sectional view schematically illustrating a cross section of the magnetic sensor taken along line III-III.

In FIGS. 1A and 1B and FIG. 2B, the magnetic balance coil 16 is represented by thick lines. Coil wirings are formed so as to turn in the X-Y plane as represented by the thick lines. In FIG. 3, a cross section of a plurality of turning coil wirings in the magnetic balance coil 16 is shown extending in the X1-X2 direction.

The magnetic balance coil 16 is located between the magnetoresistive elements 11 and the magnetic shield 15 such that a relatively small current generates an induced magnetic field that cancels the applied external magnetic field attenuated by the magnetic shield 15, thereby making it possible to operate, with low electric power, the magnetic sensor of the magnetic balance type sensor.

As shown in FIG. 2B, the magnetic balance coil 16 includes a first coil 16A and a second coil 16B arranged, when viewed in the thickness direction, line-symmetrically with respect to a straight line L1 extending in a direction (an X1-X2 direction (also referred to as an X direction)) perpendicular to the sensitivity axis in the in-plane direction of the element formation plane. Each of the first coil 16A and the second coil 16B has two parallel portions 16p extending parallel in the X direction (the in-plane perpendicular direction) when viewed in the thickness direction and crossing portions 16c extending in directions crossing the X direction and provided on either side in the longitudinal direction of the parallel portions 16p. Of the parallel portions 16p of the first coil 16A and the second coil 16B, parallel portions adjacent to each other are referred to as adjacent portions 16pa. The four magnetoresistive elements 11 are arranged below the straight line L1 located in the center of the adjacent portions 16pa (see FIG. 1A).

Each of the four magnetoresistive elements 11 has a multilayer structure similar to the multilayer structure of the GMR element 110 shown in FIG. 20, and the four magnetoresistive elements 11 form a full bridge circuit such that fixed magnetic layers 111 having different magnetization directions are disposed on the same substrate (one chip). As shown in FIG. 1A, the four magnetoresistive elements 11 are arranged in a line in the X direction below (on a Z1 side in the Z direction) the parallel portions 16p of the magnetic balance coils 16.

Each of the four magnetoresistive elements 11 includes a giant magnetoresistive element (GMR element) having a meander shape (a shape formed by connecting a plurality of long stripe patterns each extending in the X direction so as to be folded back). The magnetoresistive elements 11 each have a sensitivity axis in directions indicated by open arrows as shown in FIG. 1A and FIG. 2A. The sensitivity axis direction P of each of the four magnetoresistive elements 11 is in the Y direction. Here, the meaning of that the sensitivity axis direction P of each of the magnetoresistive elements 11 is in the Y direction is that the directions P of the sensitivity axes point in the same direction (in a parallel direction) or in the opposite directions (in an antiparallel direction) in the Y direction. A bias magnetic field is applied to the four magnetoresistive elements 11 in a direction from the X1 side of the X direction to the X2 side of the X direction, as represented by the single-headed arrows in FIG. 2A.

More specifically, as shown in FIG. 1A, the sensitivity axis direction P of the magnetoresistive element 11A and that of the magnetoresistive element 11D point to the Y2 side of the direction Y, and the sensitivity axis direction P of the magnetoresistive element 11B and that of the magnetoresistive element 11C point to the Y1 side of the direction Y.

One end of a wiring 5 is connected to an input terminal 5a and the other end of the wiring 5 is connected to one end of the magnetoresistive element 11A, the other end of the magnetoresistive element 11A and one end of the magnetoresistive element 11B are connected in series, and the other end of the magnetoresistive element 11B is connected to a ground terminal 6a via a wiring 6. The wiring 5 connected to the input terminal 5a branches in the middle and is also connected to one end of the magnetoresistive element 11C, the other end of the magnetoresistive element 11C and one end of the magnetoresistive element 11D are connected in series, and the other end of the magnetoresistive element 11D is connected to the ground terminal 6a via the wiring 6. A first midpoint potential measurement terminal 7a is connected, via a wiring 7, to a node between the other end of the magnetoresistive element 11A and one end of the magnetoresistive element 11B, and a second midpoint potential measurement terminal 8a is connected, via a wiring 8, to a node between the other end of the magnetoresistive element 11C and one end of the magnetoresistive element 11D. The magnetic sensor 10 detects the strength and the direction of an induced magnetic field (a magnetic field to be measured) induced by a measurement-target current Io flowing through a current line 81 by comparing the potential of the first midpoint potential measurement terminal 7a and the potential of the second midpoint potential measuring terminal 8a.

FIG. 3 is a cross-sectional view schematically illustrating a cross section of the magnetic sensor 10 taken along line in FIG. 1, that is, along a plane whose normal extends in a direction (Y direction) along short sides of a plurality of long stripe patterns forming the meandering shape of the magnetoresistive element 11.

The magnetoresistive elements 11 are formed on a substrate 29 and covered with an insulating layer IM made of an insulating material (such as alumina, silicon nitride, etc.). An oxidation protection layer PL made of silicon nitride (SiN) or the like is formed on the magnetic shield 15.

The magnetic shield 15 is disposed above (on the Z1 side of the Z1 direction) the four magnetoresistive elements 11 so as to be apart from the magnetoresistive elements 11. In the present specification, for convenience of illustration, the Z1 side of the Z direction is also referred to as an "upper" side, and the Z2 side of the Z direction is also referred to as a "lower" side. The separation distance between the magnetic shield 15 and the magnetoresistive elements 11 is adjusted by the thickness of the insulating layer IM located therebetween.

The magnetic shield 15 attenuates the strength of the measurement-target magnetic field applied to the magnetoresistive elements 11 and also attenuates the external magnetic field. As shown in FIG. 1A and FIG. 2C, the magnetic shield 15 includes a first shield part 15A with a hexagonal shape whose longitudinal direction extends in the in-plane perpendicular direction (X direction) perpendicular to the sensitivity axis extending along the in-plane direction of the element formation plane when viewed in the thickness direction, and second shield parts 15B each having an isosceles triangular shape disposed on either side in the longitudinal direction of the first shield part 15A such that the vertex of the isosceles triangle faces the first shield part 15A.

The magnetic shield 15 is made of a soft magnetic material containing iron group elements such as Fe, Co, and Ni. The thickness of the magnetic shield 15 is arbitrarily set within a range in which the magnetic shield 15 provides a predetermined magnetic shielding function. By way of non-limiting example, the thickness of the magnetic shield 15 is set to be greater than or equal to 1 μm and smaller than or equal to 50 The thickness of the magnetic shield 15 may be preferably greater than or equal to 5 μm and smaller than or equal to 40 μm and more preferably, greater than or equal to 10 μm and smaller than or equal to 35 μm.

To suppress the influence of the residual magnetization of the magnetic shield 15, it is preferable to provide the large distance between the magnetic shield 15 and the magnetoresistive elements 11. However, if the distance between the magnetic shield 15 and the magnetoresistive elements 11 is increased to meet the above requirement, the result is a reduction in the ability of the magnetic shield to shield the external magnetic field 15. Therefore, the distance in the Z direction between the magnetic shield 15 and the magnetoresistive elements is set taking into account both the influence of the residual magnetization and the ability to shield the external magnetic field. The distance in the Z direction is set to be, for example, greater than or equal to 5 μm and smaller than or equal to 13 μm.

The magnetic shield 15 can be produced by any proper methods such that an underlayer is first formed by a dry process such as sputtering or a wet process such as electroless plating, and then a resist layer patterned into a predetermined shape is formed on the underlayer, and finally a soft magnetic layer is formed by electroplating.

When viewed in the Z direction (the thickness direction), the first shield part 15A of the magnetic shield 15 overlaps the four magnetoresistive elements 11 along the line L1 connecting the two farthest vertices of the hexagons. That is, when viewed in the Z direction (the thickness direction), the line L1 passes through the center of each of the four magnetoresistive elements 11.

The magnetic shield 15 further includes the second shield parts 15B magnetically coupled with the first shield part. The second shield parts 15B are provided at either end, in the X direction, of the first shield part 15A so as to cover the magnetoresistive elements 11 when viewed in the X direction (the in-plane perpendicular direction). The vertices of the second shield parts 15B each having the shape of an isosceles triangle are connected to the respective two furthest vertices of the first shield part 15A having the hexagonal shape. That is, the second shield parts 15B each have a component extending in the Z direction (the thickness direction). This configuration makes it possible for the second shield parts 15B to attenuate the perpendicular magnetic field in the X direction. That is, a magnetic path is formed such that it extends from one of the second shield parts 15B to the other one of the second shield parts 15B via the first shield part 15A, thereby attenuating the perpendicular magnetic field applied to the magnetoresistive elements 11. Here, the meaning of that the second shield parts 15B cover the magnetoresistive elements 11 is that the second shield parts 15B are disposed so as overlap the magnetoresistive elements 11 when viewed in the X direction (the in-plane perpendicular direction). As shown in FIG. 3, the second shield parts 15B covering the magnetoresistive elements 11 each intersect a straight line H extending in the X-direction (the in-plane perpendicular direction) passing through the center, in the Z direction (the thickness direction), of each of the four magnetoresistive elements 11.

The second shield parts 15B are disposed so as not to overlap the magnetic balance coil 16 when viewed in the thickness direction. The second shield parts 15B can be formed, for example, by forming a film after engraving in the Z direction the separation portions between the crossing portions 16c of the first coil 16A and the crossing portions 16c of the second coil 16B.

As shown in FIGS. 1A and 1B, the first shield part 15A is disposed such that when viewed in the thickness direction, the first shield part 15A overlaps the adjacent portions 16pa of the magnetic balance coil 16 and the magnetoresistive elements 11 but does not overlap the crossing portions 16c of the magnetic balance coil 16. The first shield part 15A provides the effect of attenuating the external magnetic field applied to the magnetoresistive elements 11 and the effect of enhancing the magnetic balance coil 16.

The first shield part 15A has a shape symmetrical with respect to the straight line L1 (see FIG. 2C) when viewed in the Z direction (the thickness direction). By using this shape, it is possible to achieve a higher degree of uniformity in the magnitude of the magnetic field applied to the magnetoresistive elements 11 and reduce the deviation of the midpoint potential. In addition, the influences of the magnetic field caused by the residual magnetization of the magnetic shield 15 on the four magnetoresistive elements 11 can be made equal for positive and negative polarities.

When viewed in the thickness direction, the first shield part 15A is disposed so as to overlap only the parallel portions 16p of the magnetic balance coil 16. This makes it possible to greatly reduce the influence of the magnetic field from the crossing portions 16c on the first shield part 15A due to the current flowing through the magnetic balance coil 16. Therefore, when the first shield part 15A enhances the magnetic field applied to the magnetoresistive elements 11 by the adjacent portions 16pa of the magnetic balance coil 16, the first shield part 15A is hardly affected by the magnetic field from the crossing portions 16c.

As shown in FIGS. 1A and 1B, when viewed in the thickness direction, the second shield parts 15B are disposed between the crossing portions 16c of the first coil 16A and the crossing portions 16c of the second coil 16B, that is, the second shield parts 15B are disposed in portions (hereinafter also referred to as separation portions) where the first coil 16A and the second coil 16B are separated from each other on the either side in the X direction of the adjacent portions 16pa. By disposing the second shield parts 15B in the separation portions, it becomes possible for the second shield parts 15B, as with the first shield part 15A, to hardly be affected by the magnetic field from the crossing portions 16c due to the current flowing through the magnetic balance coil 16. Thus, the first shield part 15A is hardly affected by the magnetic field from the crossing portions 16c via the magnetically connected second shield parts 15B. Therefore, it is possible to greatly reduce the adverse effect of the second shield parts 15B on the effect of enhancing the magnetic balance coil 16 by the first shield part 15A.

In the magnetic sensor 10 shown in FIGS. 1A and 1B, FIGS. 2A to 2C, and FIG. 3, the first shield part 15A and the second shield parts 15B are disposed such that they are connected to each other at end portions in the X direction. As a result, a magnetic path is formed from one of the second shield parts 15B to the other one of the second shield parts 15B via the first shield part 15A, and thus it becomes possible to effectively attenuate the external magnetic field in the X direction. Note that the first shield part 15A and the second shield parts 15B may be formed integrally at the same time using the same material, or may be formed into separate parts using different materials.

As shown in FIG. 2C and FIG. 3, the second shield parts 15B each include a connection end 15E1 connected to the first shield part 15A and a non-connection end 15E2 on a side opposite, in the X direction (the in-plane perpendicular direction), to the connection end 15E1. As shown in FIG. 1A and FIG. 3, when viewed in the thickness direction, the distance H2 between the magnetoresistive elements 11 and the non-connection end 15E2 is greater than the distance H1 between the magnetoresistive elements 11A to 11D and the connection end 15E1. Each of the second shield parts 15B has a component extending from the connection end 15E1 toward the non-connection end 15E2 in the Z direction (the thickness direction) and in the X direction (the in-plane perpendicular direction). In this configuration, a magnetic path is formed which extends from the non-connection end 15E2 of one of the second shield parts 15B to the non-connection end 15E2 of the other one of the second shield parts 15B via the connection ends and the first shield part 15A, and thus it is possible to efficiently attenuate a magnetic field in the X direction perpendicular to the sensitivity axis direction.

Note that the distance H1 and the distance H2, when viewed from the thickness direction, from the connection end 15E1 or the non-connection end 15E2 of the second shield part 15B to the magnetoresistive elements are defined by the distance in the X direction from one magnetoresistive element 11 located closest to the second shield part 15B.

In the above-described embodiment, the specific example has been described in which the GMR element 110 (see FIG. 20) is used in each magnetoresistance effect element 11 of the magnetic sensor 10, but this is only by way of example and not by way of limitation. In one non-limiting example, the magnetoresistive element is realized using one or more elements selected from the group consisting of an anisotropic magnetoresistive element (AMR element), a giant magnetoresistive element (GMR element) and a tunnel magnetoresistive element (TMR element).

In a case where the fixed magnetic layer of the GMR element constituting each of the magnetoresistive elements 11A to 11D of the magnetic sensor 10 have a self-pinned structure, magnetization of the fixed magnetic layer can be achieved by forming the film in a magnetic field, and heat treatment in a magnetic field is not required after the film formation. This makes it possible to form a full bridge circuit by disposing, on the same substrate, GMR elements whose fixed magnetic layers have different magnetization directions.

The magnetic sensor 10 having the magnetoresistive elements according to one embodiment of the present invention can be suitably used as a current sensor. A specific example of a magnetic balance type current sensor can be realized by a current sensor 10A using the magnetic sensor 10 shown in FIG. 1A and FIG. 3. In this current sensor 10A, a current line 81, through which a current Io to be measured flows, is provided so as to extend in the X direction as shown in FIG. 1A. The current sensor 10A includes magnetoresistive elements 11A to 11D and the magnetic shield 15, and further includes the spiral-shaped magnetic balance coil 16 located between the magnetoresistive elements 11 and the magnetic shield 15.

An induced magnetic field generated by a current Io to be measured, which is a magnetic field to be measured, is applied to the magnetoresistive elements 11 in a direction along the sensitivity axis direction P (the Y direction). Part of the magnetic field to be measured passes through the magnetic shield 15 having a higher magnetic permeability, and this causes a reduction in the strength of the magnetic field to be measured that is substantially applied to the magnetoresistive elements 11. Therefore, it is allowed to reduce the amount of the current flowing through the magnetic balance coil 16, which is for generating an induced magnetic field so as to cancel the magnetic field generated by the current Io to be measured substantially applied to the four magnetoresistive elements 11, and thus saving of power for the current sensor is achieved.

Figure 4:
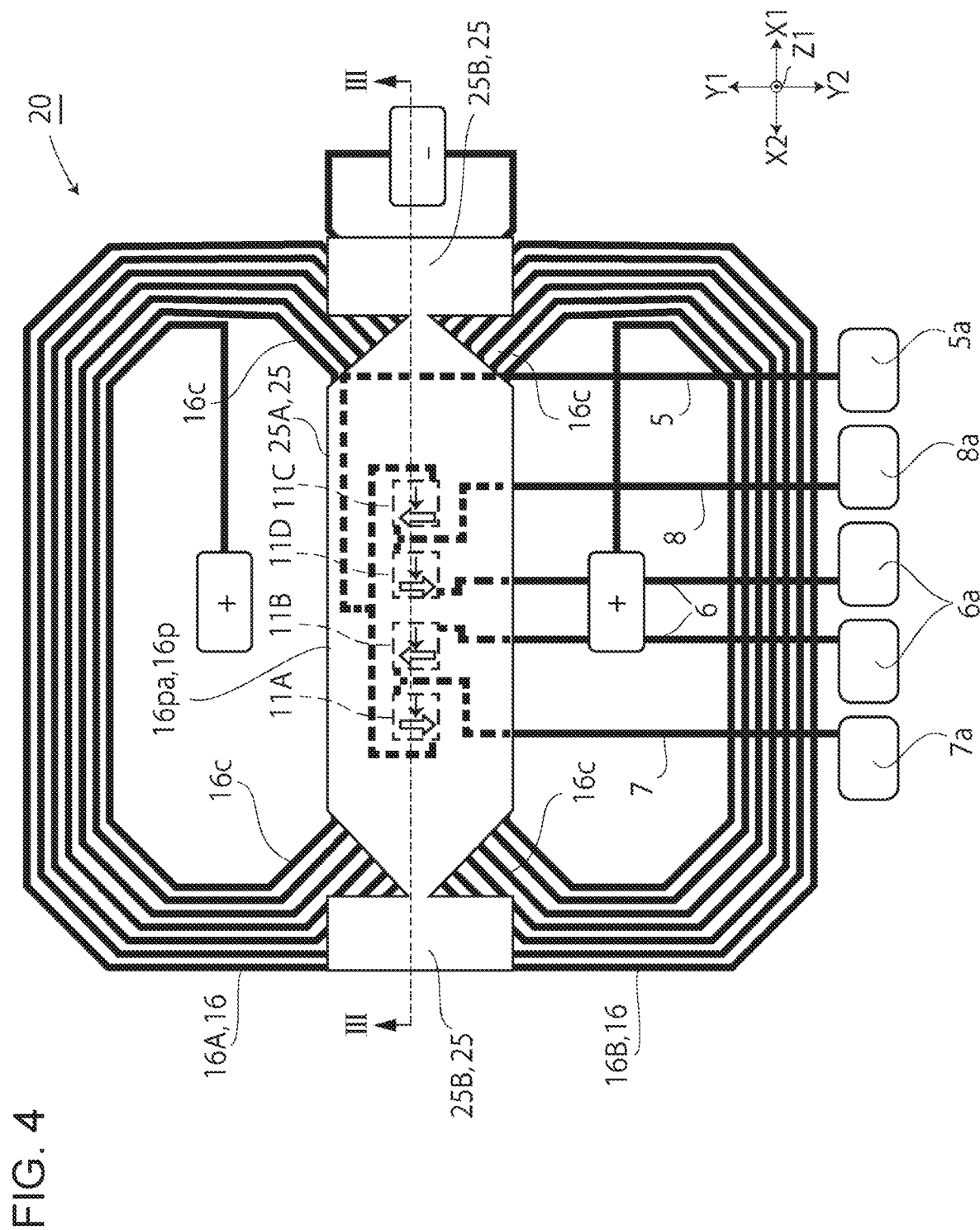
FIG. 4 is a plan view schematically illustrating a modification of a magnetic sensor.

FIG. 4 is a plan view schematically illustrating a magnetic sensor 20 which is a modification of the magnetic sensor 10 shown in FIG. 1A. The magnetic sensor 20 differs from the magnetic sensor 10 in the shape of the second shield parts 25B of the magnetic shield 25 when viewed in the thickness direction.

In the magnetic shield 25, the second shield parts 25B each having a rectangular shape when viewed in the thickness direction are provided on either side, in the longitudinal direction, of the first shield part 25A whose longitudinal direction extends in the X direction (the in-plane perpendicular direction) perpendicular to the Y direction (the direction of the sensitivity axis). Therefore, when viewed in the thickness direction, part of each of the second shield parts 25B overlaps the crossing portion 16c located on corresponding one of sides of the adjacent portion 16pa.

Note that only a partial area of each of the second shield parts 25B overlaps the corresponding one of the crossing portions 16c, and the first shield part 25A is connected to the second shield parts 25B such that narrowed portions of either ends of the first shield part 25A in the longitudinal direction are connected to corresponding second shield parts 25B. This configuration can reduce the influence of the magnetic field from the crossing portions 16c on the first shield part 25A via the second shield parts 25B. Therefore, in the effect of enhancing the magnetism of the magnetic balance coil 16 of the first shield part 25A, it is possible to suppress noise caused by the magnetic field from the crossing portions 16c.

The difference between the magnetic sensor 20 and the magnetic sensor 10 is only in the shape of the second shield parts 25B when viewed in the thickness direction. Therefore, the cross section of the magnetic sensor 20 taken along line in FIG. 4 is similar to that shown in FIG. 3.

Figure 5:
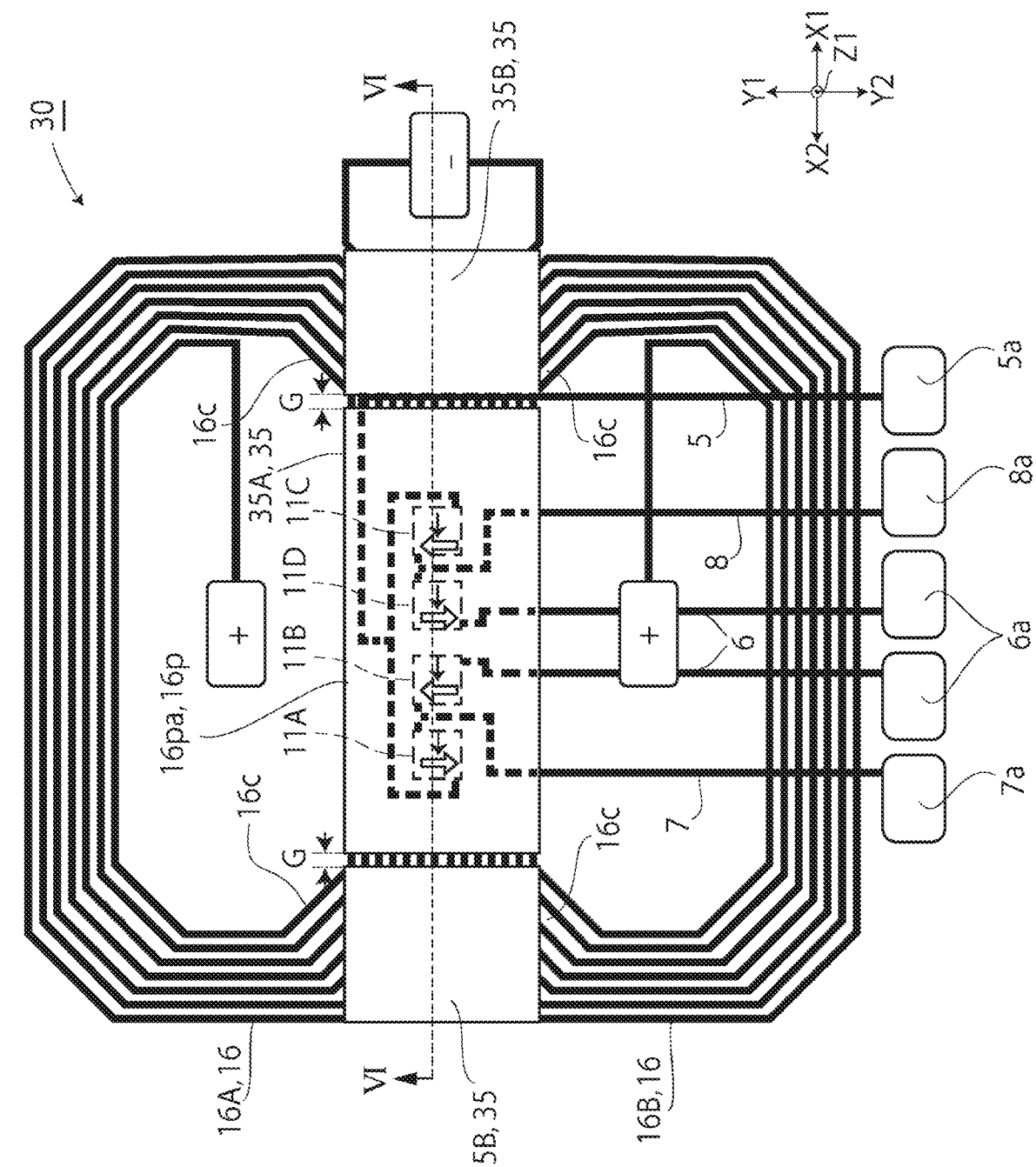
FIG. 5 is a plan view schematically illustrating another modification of a magnetic sensor.

FIG. 5 is a plan view schematically illustrating a magnetic sensor 30, which is another modification of the magnetic sensor 10 shown in FIG. 1A. The magnetic sensor 30 differs from the magnetic sensor 10 in the shape of the magnetic shield 35 when viewed in the thickness direction.

In the magnetic shield 35, the first shield part 35A longitudinally extending in the X direction and the second shield parts 35B provided on either side, in the longitudinal direction, of the magnetic shield 35 are all rectangular when viewed in the thickness direction, and the widths of these rectangles in the Y direction are all equal. A gap G that can provide magnetic coupling is formed between the first shield part 35A and each second shield part 35B. By setting the gap G to have an appropriate size, it is possible to magnetically coupling the first shield part 35A and each second shield part 35B thereby forming a magnetic path for bypassing the perpendicular magnetic field in the X direction.

The provision of the appropriate gap G also makes it possible to suppress noise caused by the magnetic field from the crossing portions 16c via the second shield parts 35B in the enhancing of the magnetic balance coil 16 by the first shield part 35A. From the viewpoint of forming the magnetic path in the perpendicular direction while suppressing the influence of noise from the crossing portions 16c, the gap G between the first shield part 35A and each second shield part 35B preferably has a size in a range from 3 to 25 μm and more preferably from 5 to 25 μm.

Figure 6:
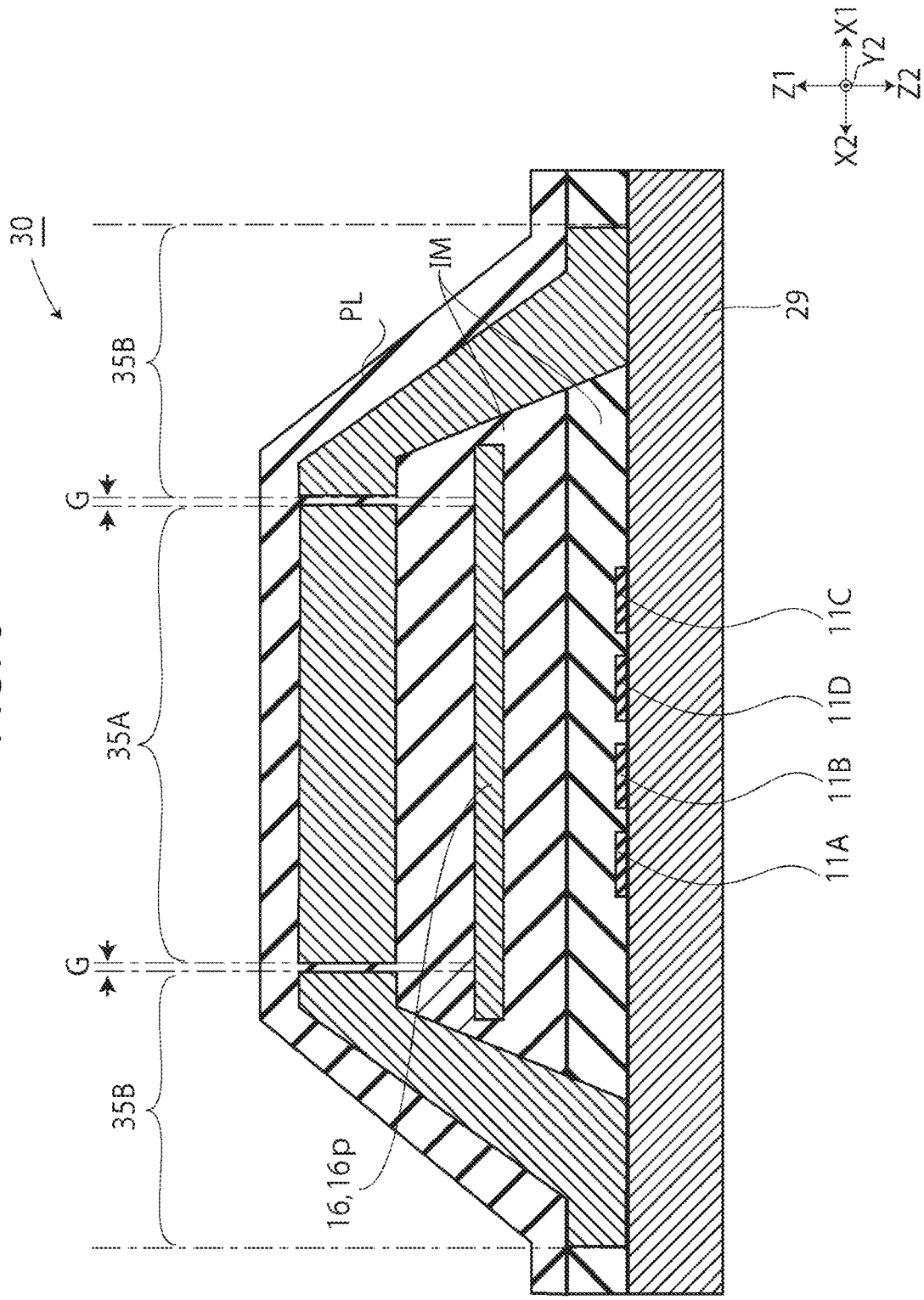
FIG. 6 is a cross-sectional view schematically illustrating a cross section of the magnetic sensor taken along line VI-VI in FIG. 5.

FIG. 6 is a cross-sectional view schematically illustrating a cross section of the magnetic sensor 30 taken along line VI-VI in FIG. 5. In the magnetic sensor 30, partial regions of the parallel portion 16p of the magnetic balance coil 16 are not covered with the first shield part 35A located above (on the Z1 side of the direction Z1). Therefore, from the viewpoint of the enhancement effect of the first shield part 35A, it is more preferable to use the magnetic sensor 30 in which the parallel portion 16p of the magnetic balance coil 16 is entirely covered with the first shield part 15A (see FIG. 1A, FIG. 3).

Second Embodiment

Figure 7:
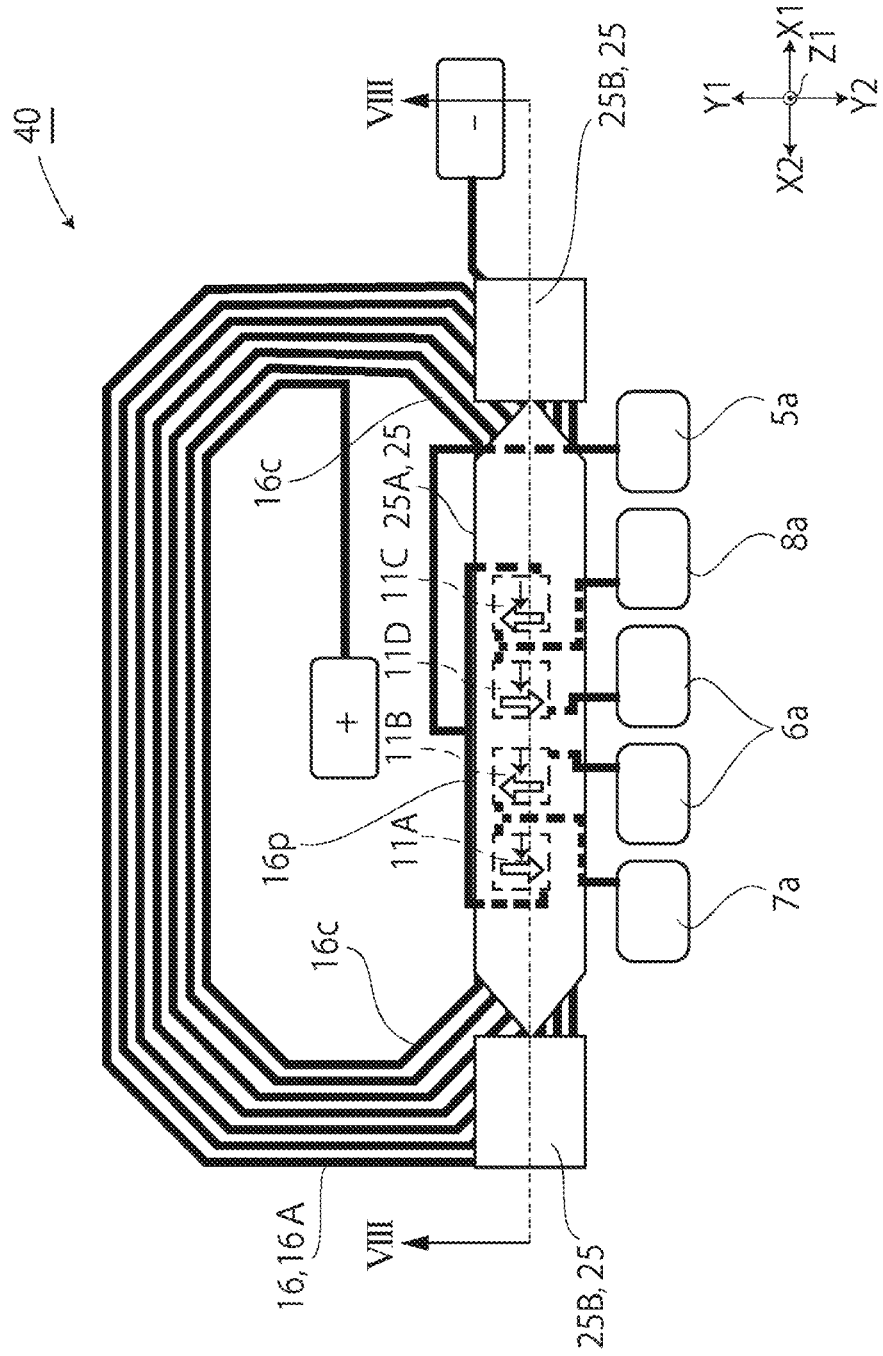
FIG. 7 is a plan view schematically illustrating a structure of a magnetic sensor according to a second embodiment.

FIG. 7 is a plan view schematically illustrating a structure of a magnetic sensor 40 according to a second embodiment.

Figure 8:
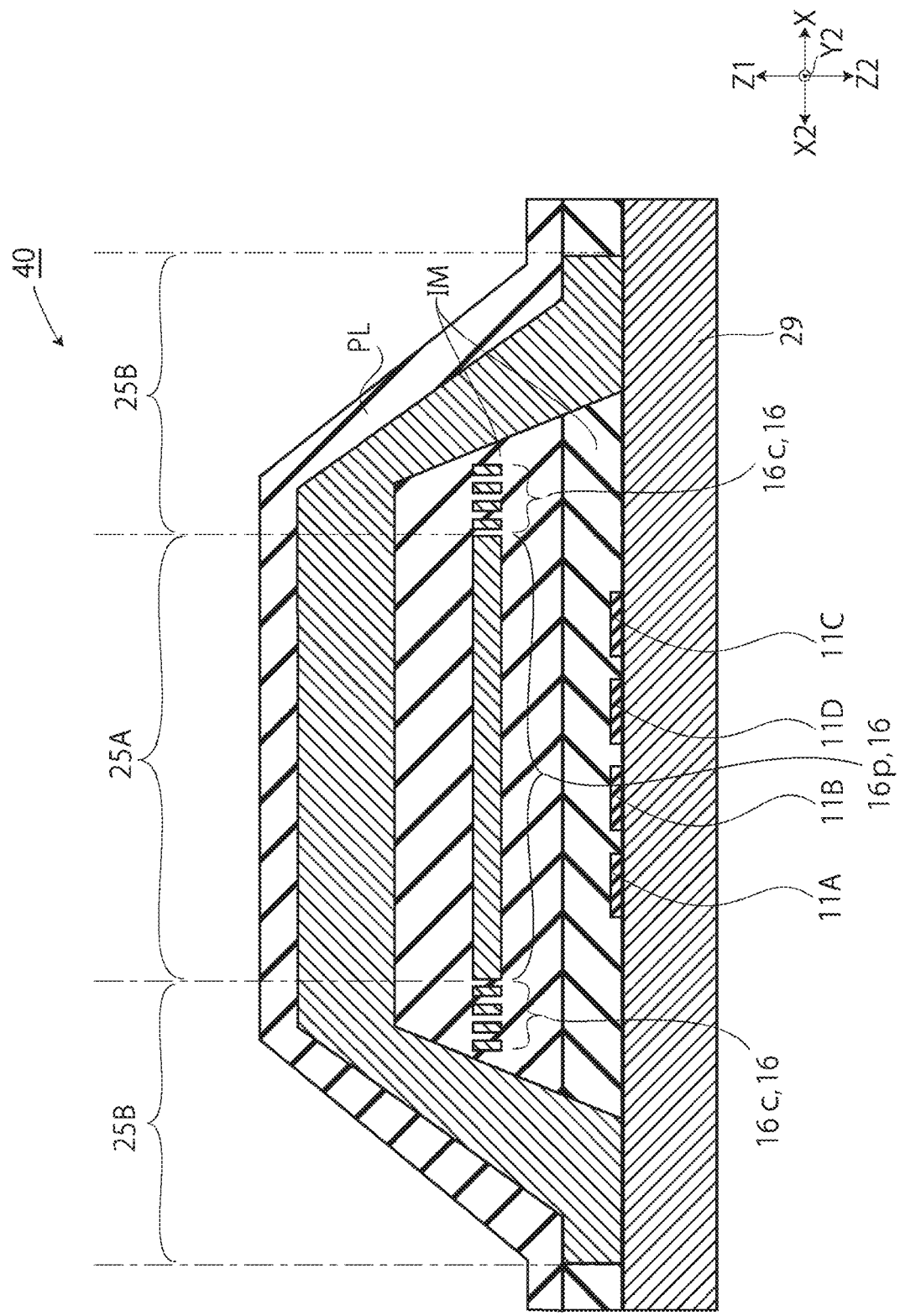
FIG. 8 is a cross-sectional view schematically illustrating a cross section of the magnetic sensor taken along line VIII-VIII in FIG. 7.

FIG. 8 is a cross-sectional view schematically illustrating a cross section of the magnetic sensor 40 taken along line VIII-VIII in FIG. 7. As shown in FIGS. 7 and 8, the magnetic sensor 40 according to the present embodiment is different from the magnetic sensor 20 according to the first embodiment shown in FIG. 4 in that the magnetic balance coil 16 includes only the first coil 16A.

As shown in FIG. 8, the second shield parts 25B of the magnetic sensor 40 overlap the crossing portions 16c of the magnetic balance coil 16 across relatively greater areas than in the magnetic sensor 20. Therefore, from the viewpoint of the effect of enhancing the magnetic balance coil 16 by the first shield part 35A, the magnetic sensor 20 having relatively smaller areas that overlap the crossing portions 16c (see FIGS. 3 and 4) is more preferable than the magnetic sensor 40.

Figure 9:
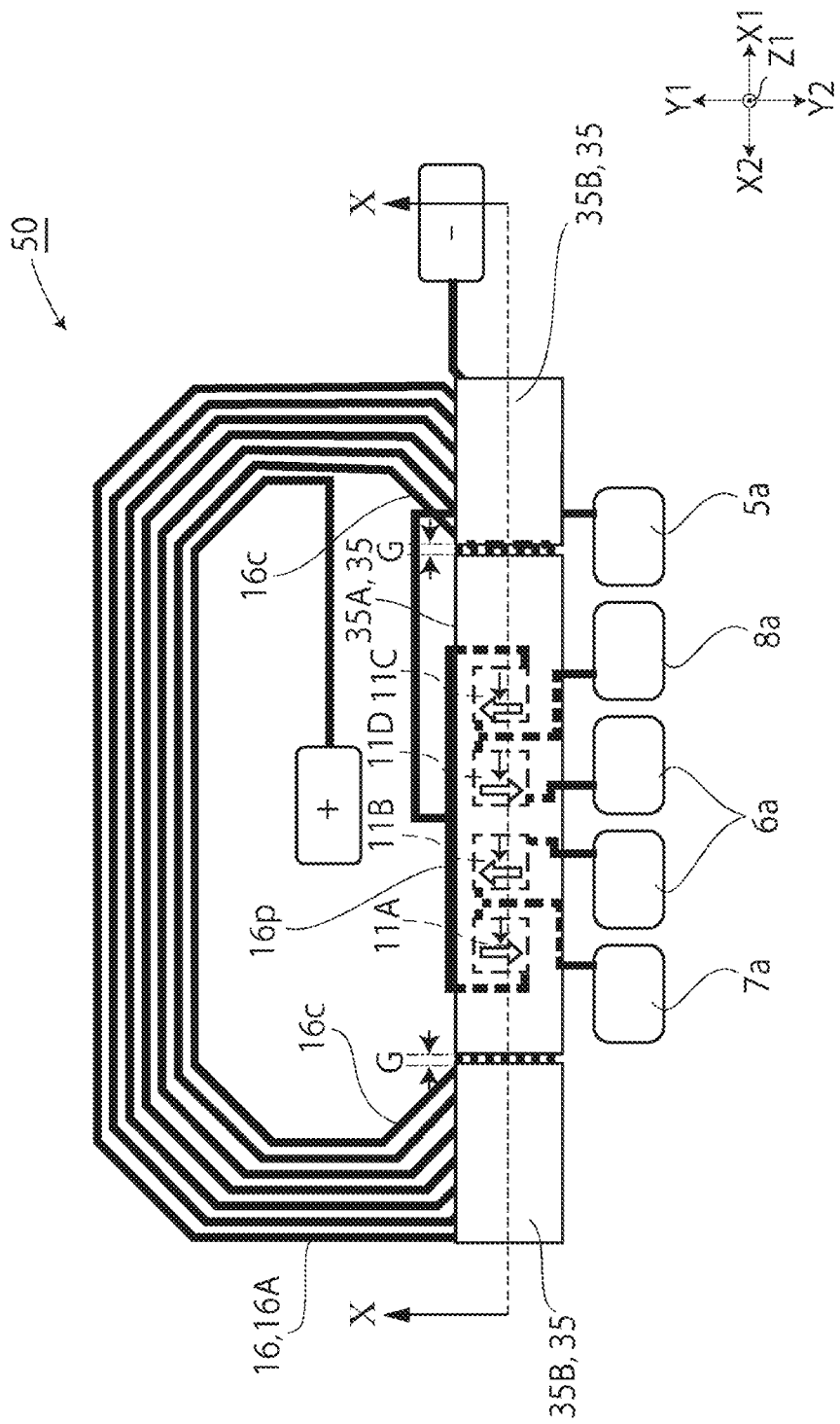
FIG. 9 is a plan view schematically illustrating a modification of a magnetic sensor.
Figure 10:
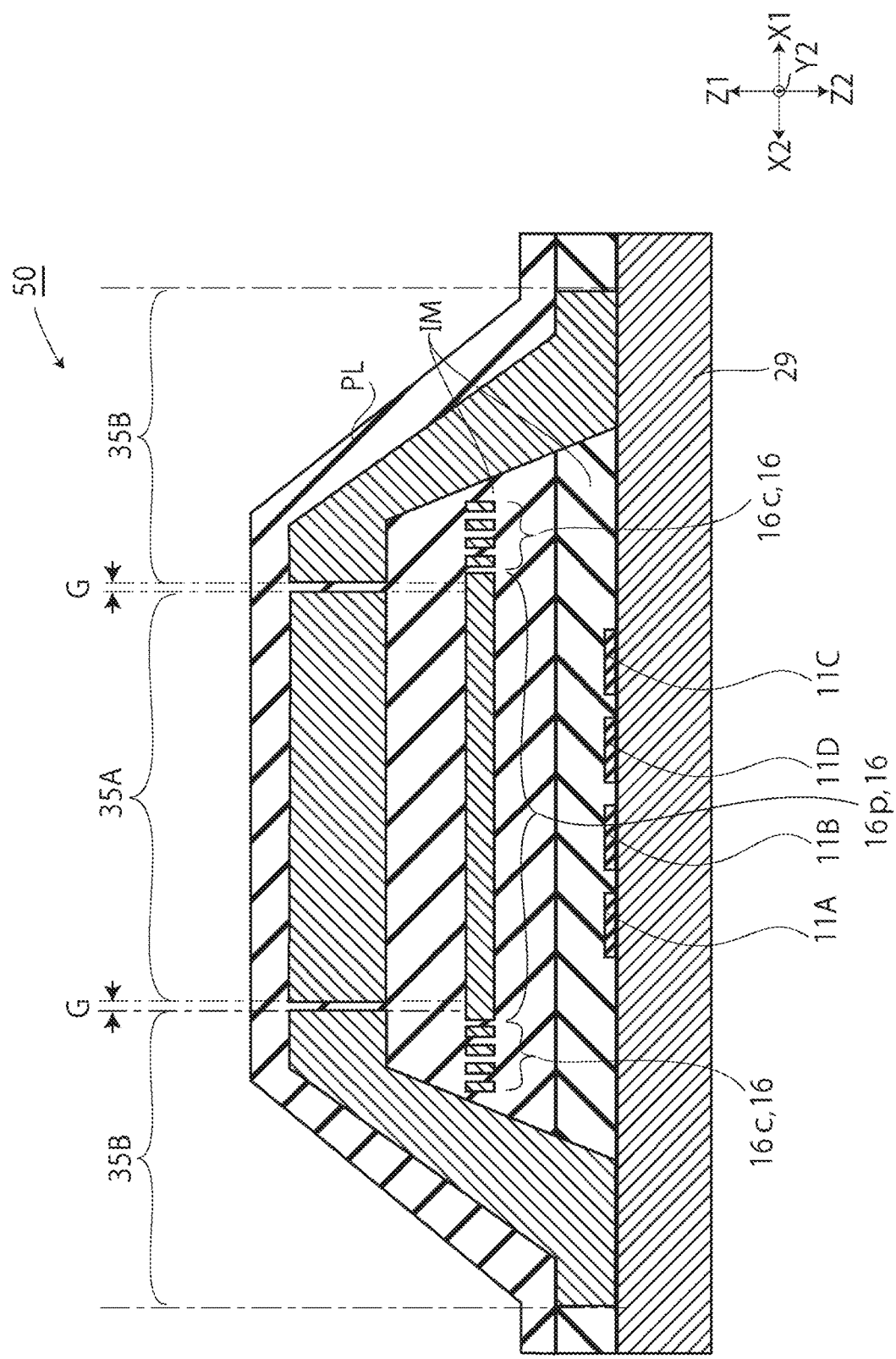
FIG. 10 is a cross-sectional view schematically illustrating a cross section of the magnetic sensor taken along line X-X in FIG. 9.

FIG. 9 is a plan view schematically illustrating a magnetic sensor 50 which is a modification of the magnetic sensor 40 shown in FIG. 7. FIG. 10 is a cross-sectional view schematically illustrating a cross section of the magnetic sensor 50 taken along line X-X in FIG. 9. As shown in these figures, the magnetic sensor 50 differs from the magnetic sensor 40 in the shape of the magnetic shield 35 when viewed in the thickness direction.

A gap G that can provide magnetic coupling is formed between the first shield part 35A and each second shield part 35B constituting the magnetic shield 35. When the gap G has an appropriate gap size, it is possible for the magnetic shield 35 to form a magnetic path for a magnetic field perpendicular to the X direction, that is, when a magnetic field is applied from the Y direction, a magnetic path is formed from one of the second shield parts 35B to the other one of the second shield parts 35B via the first shield part 35A. It is also possible to suppress the adverse influence of the magnetic field of the crossing portion 16c on the enhancement effect of the first shield part 35A.

Note that the embodiments described above are for facilitating understanding of the present invention, and not for limiting the present invention. Therefore, each element disclosed in the above embodiments may be replaced by any equivalent or various modifications without departing from the technical scope of the present invention.

EXAMPLES

The present invention is described in further detail below with reference to examples. Note that the scope of the present invention is not limited by these examples.

Example 1

Figure 11A:
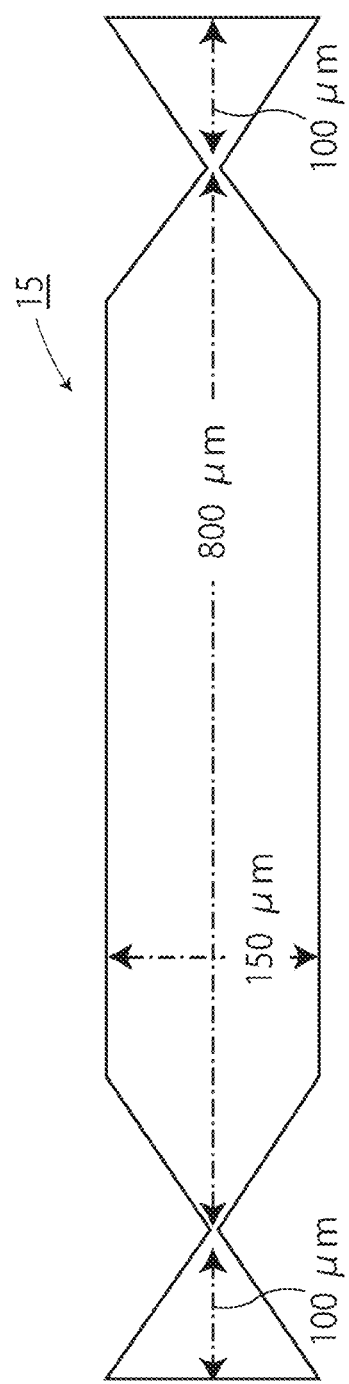
FIG. 11A is a plan view illustrating a shape of a magnetic shield of a magnetic sensor according to Example 1.

FIG. 11A is a plan view illustrating a shape of a magnetic shield 15 of a magnetic sensor 10 according to Example 1 when viewed in the thickness direction. Using the magnetic shield 15 having the shape shown in FIG. 11A, the magnetic sensor 10 shown in FIG. 3 was produced. The distance D1 between the magnetoresistive elements 11 and the magnetic shield 15 (located right above the magnetoresistive elements, see FIG. 3) was set to 9.0 μm (same for all Examples and Comparative Examples), and the rated magnetic field of the magnetic sensor 10 was set to ±18 mT.

As the magnetoresistive element 11, a GMR element having a film structure described below was used. Note that in the following description about the film structure, numeral values in parentheses indicate thicknesses in units of Å.

Underlayer: NiFeCr (42)/Fixed Magnetic Layer: $Fe_{60at\%}Co_{40at\%}$ (9)/Non-magnetic Material Layer: Ru (3.6)/Fixed Magnetic Layer: $Co_{90at\%}Fe_{10at\%}$ (24)/Non-magnetic Material Layer: Cu (20)/Free Magnetic Layer: [$Co_{90at\%}Fe_{10at\%}$ (10)/$N_{82at\%}Fe_{17.5at\%}$ (70)]/Antiferromagnetic Layer: IrMn(80)/Protective Layer: Ta (100)

Example 2

Figure 11B:
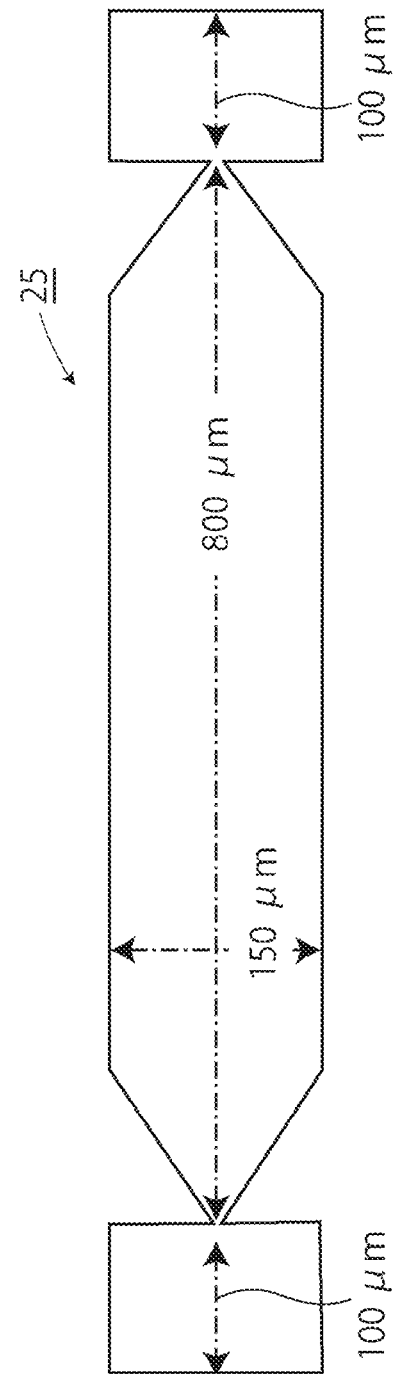
FIG. 11B is a plan view illustrating a shape of a magnetic shield of a magnetic sensor according to Example 2.

FIG. 11B is a plan view illustrating a shape of a magnetic shield 25 of a magnetic sensor according to Example 2 when viewed in the thickness direction. Using the magnetic shield 25 having the shape shown in FIG. 11B, the magnetic sensor 40 shown in FIGS. 7 and 8 was produced.

The distance D1 between the magnetic shield 25 and the magnetoresistive element 11 and the rated magnetic field were the same as in Example 1, and, as the magnetoresistive element 11, a GMR element having the same film configuration as in Example 1 was used.

Example 3

Figure 12A:
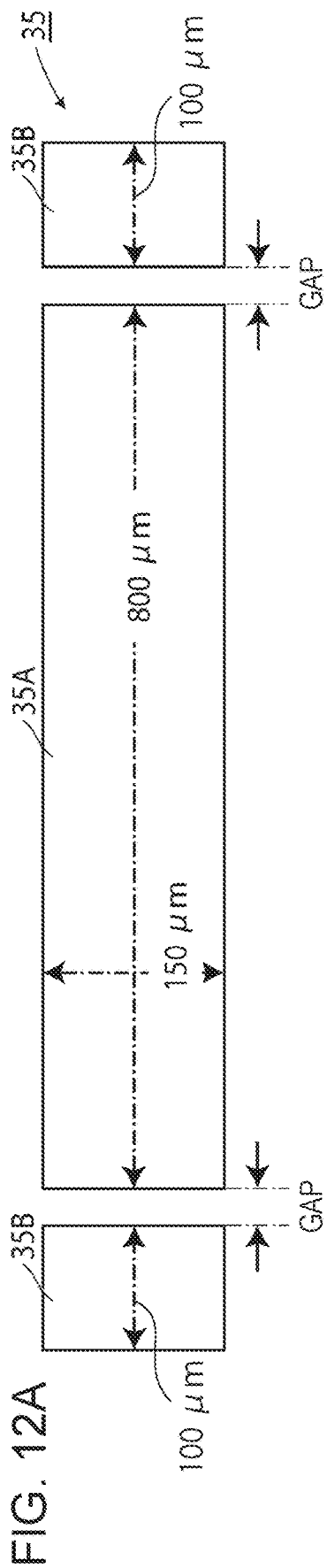
FIG. 12A is a plan view illustrating a shape and a gap of a magnetic shield of a magnetic sensor of Example 3.

FIG. 12A is a plan view illustrating a shape of a magnetic shield 35 of a magnetic sensor 30 according to Example 3 when viewed in the thickness direction. The magnetic sensors 30 shown in FIGS. 5 and 6 with the magnetic shield 35 having the shape shown in FIG. 12A was produced for respective gaps of 3 μm, 5 μm, 10 μm, 20 μm, 30 μm, 50 μm, and 100 μm.

The distance D1 between the magnetic shield 35 and the magnetoresistive element 11 and the rated magnetic field were the same as in Example 1, and, as the magnetoresistive element 11, a GMR element having the same film configuration as in Example 1 was used.

Comparative Example 1

Figure 13:
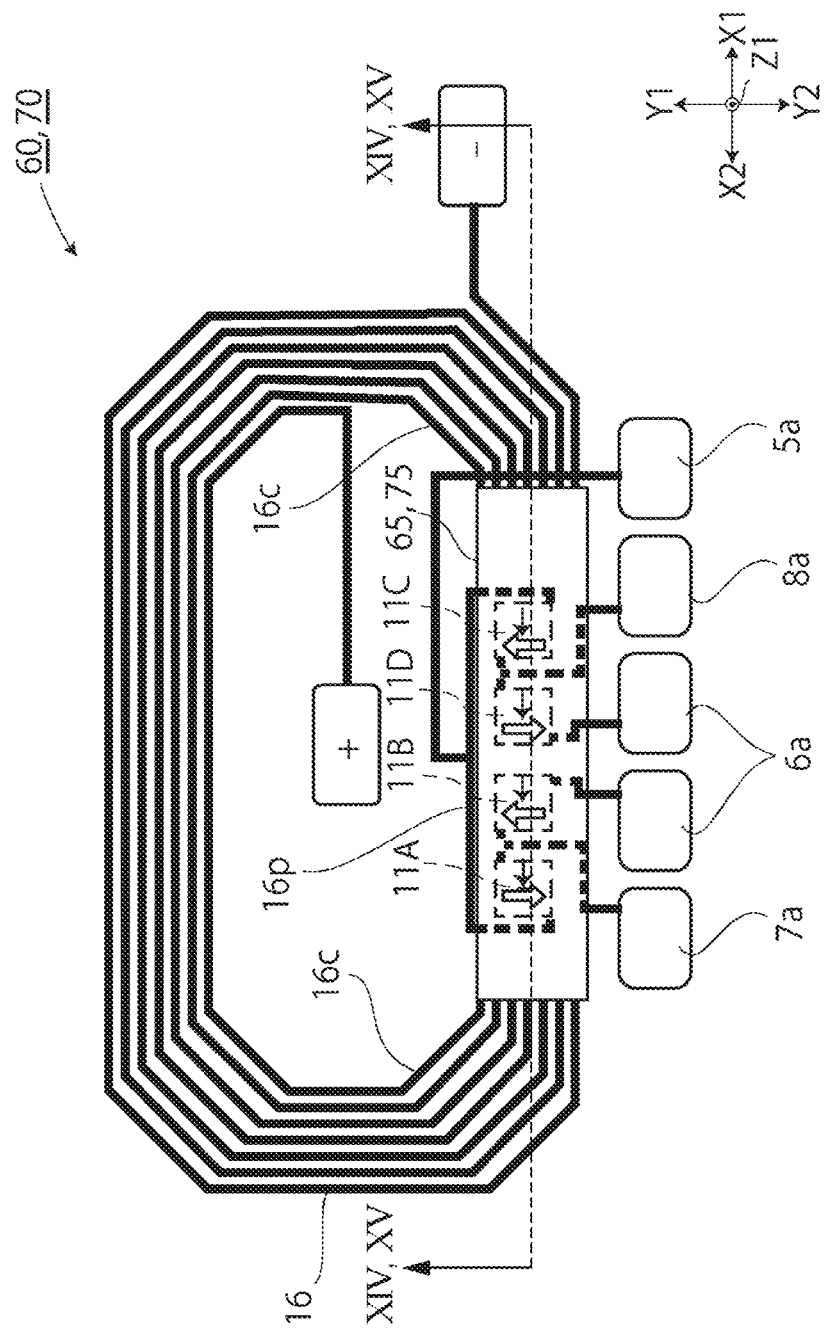
FIG. 13 is a plan view schematically illustrating a magnetic sensor according to Comparative Example 1 and Comparative Example 2.
Figure 14:
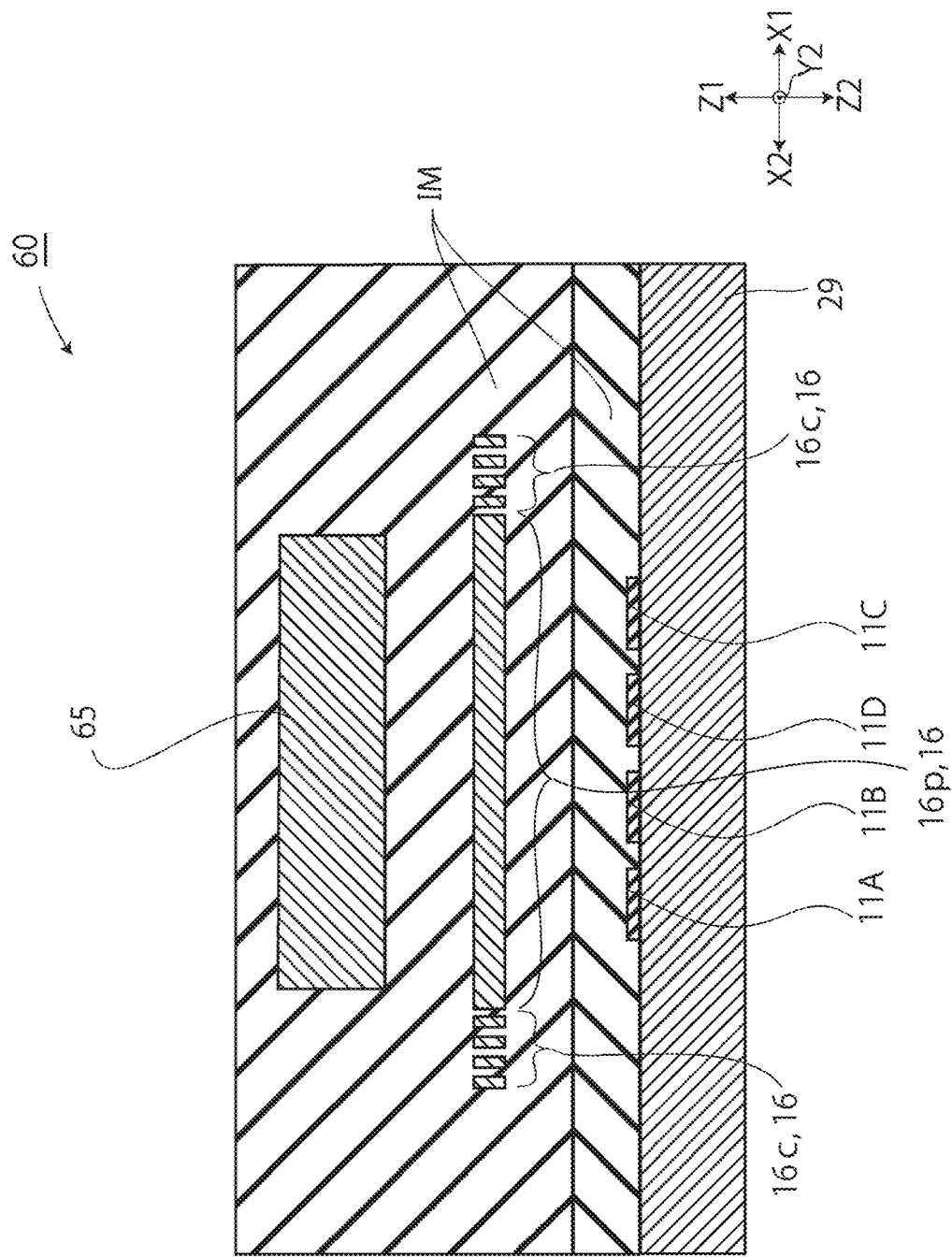
FIG. 14 is a cross-sectional view schematically illustrating a cross section of a magnetic sensor according to Comparative Example 1 taken along line XIV-XIV in FIG. 13.

A magnetic sensor 60 having a magnetic shield 65 having the planar shape shown in FIG. 13 and the cross-sectional shape shown in FIG. 14 was produced. The planar shape of the magnetic shield 65 was a rectangle with a width of 150 μm and a length of 800 μm, which corresponds to a structure obtained by removing the second shield parts 35B from the magnetic shield 35 of Example 3 shown in FIG. 12A.

The distance D1 between the magnetic shield 65 and the magnetoresistive element 11 and the rated magnetic field were the same as in Example 1, and, as the magnetoresistive element 11, a GMR element having the same film configuration as in Example 1 was used.

Comparative Example 2

Figure 15:
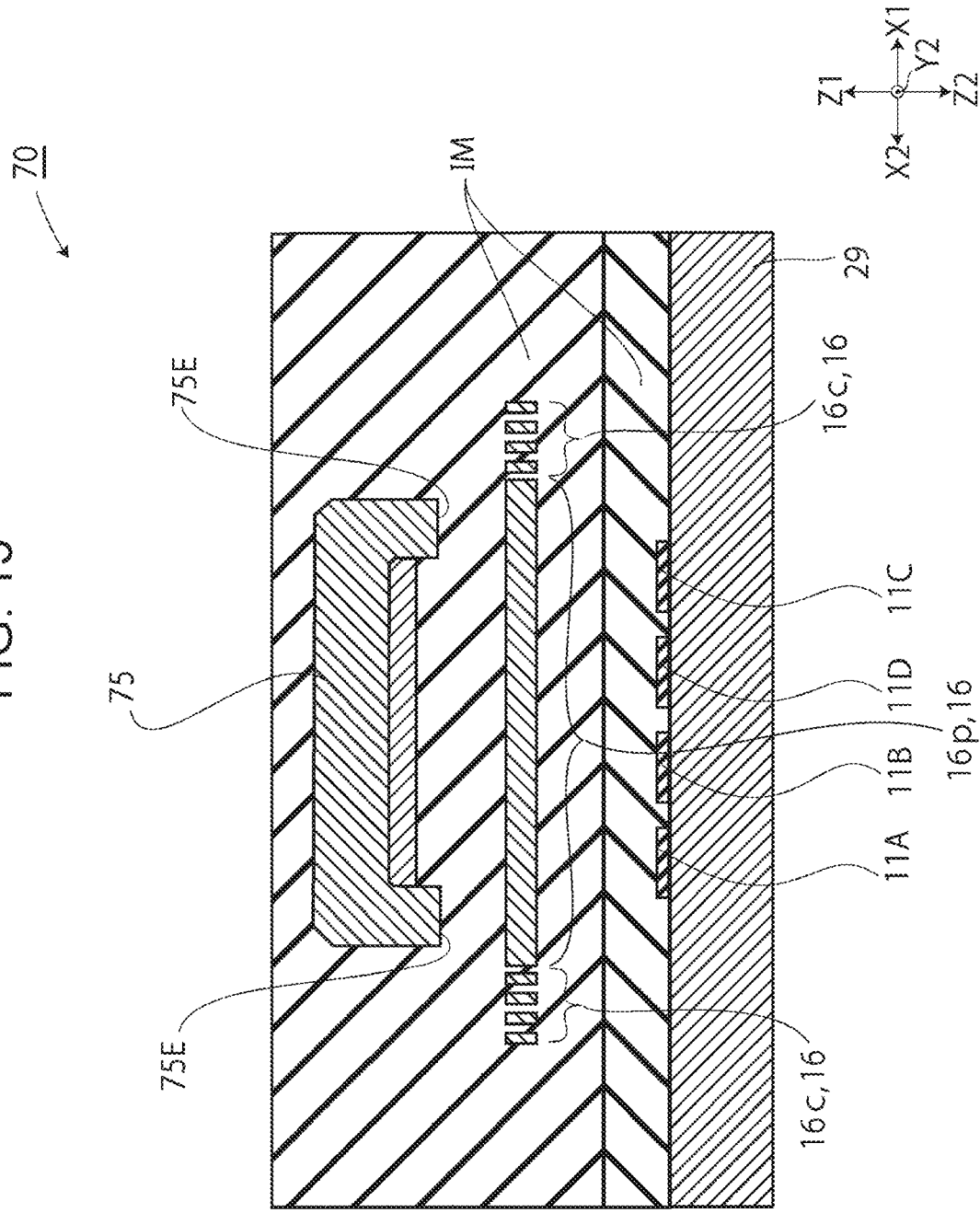
FIG. 15 is a cross-sectional view schematically illustrating a cross section of a magnetic sensor according to Comparative Example 2 taken along line XV-XV in FIG. 13.

A magnetic sensor 70 having a magnetic shield 75 having the planar shape shown in FIG. 13 and the cross-sectional shape shown in FIG. 15 was produced. The planar shape of the magnetic shield 65 was a rectangle with a width of 150 μm and a length of 800 μm, which corresponds, as with the magnetic shield 65 of Comparative Example 1, to a structure obtained by removing the second shield parts 35B from the magnetic shield 35 of Example 3 shown in FIG. 12A. However, as shown in FIG. 15, the magnetic shield 65 of Comparative Example 2 was different from that of Comparative Example 1 in that each of ends 75E on either side of the magnetic shield 75 had a magnetic absorption portion protruding by 2.5 μm toward the magnetoresistive element 11 on the Z2 side of the Z direction.

The distance D1 between the magnetic shield 75 and the magnetoresistive element 11 and the rated magnetic field were the same as in Example 1, and, as the magnetoresistive element 11, a GMR element having the same film configuration as in Example 1 was used.

Measurement Example 1: Measurement of Magnitude of Change in Offset

For each of the magnetic sensors according to Examples 1 and 2 and the magnetic sensors according to Comparative Examples 1 and 2, the magnitude of change in output offset was measured while changing the external magnetic field (the stress magnetic field, the perpendicular magnetic field) applied in the direction perpendicular to the sensitivity axis in steps of ±X mT (X=1 mT for the gaps of 5 to 30 μm and 5 to 20 μm, 5 mT for gaps of 20 to 30 μm) such that the applied external magnetic field was alternately changed between positive and negative values and the absolute value of the applied external magnetic field was increased in the steps described above.

Figure 16:
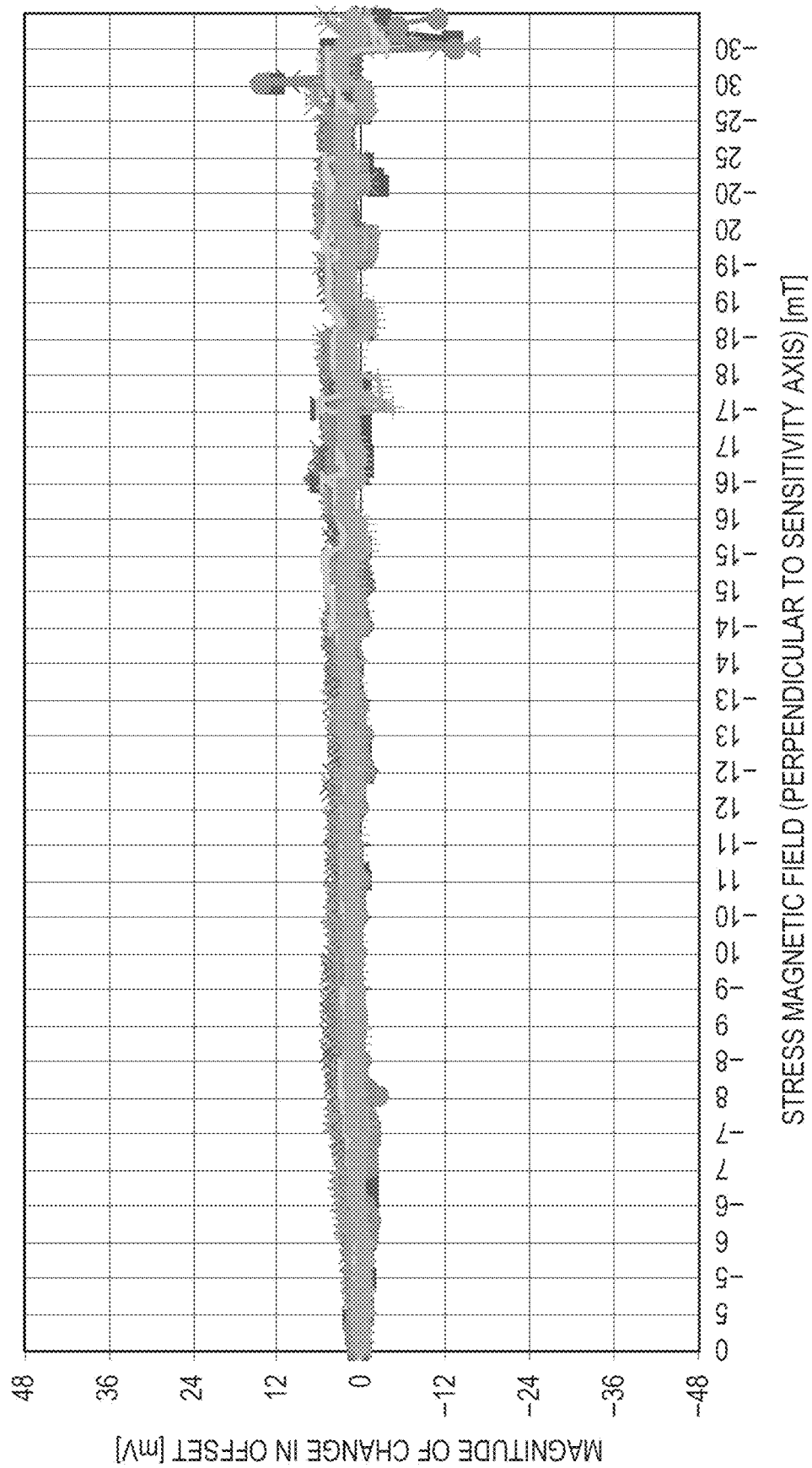
FIG. 16 is a graph showing a tolerance of a magnetic sensor to an external magnetic field according to Example 1.
Figure 17:
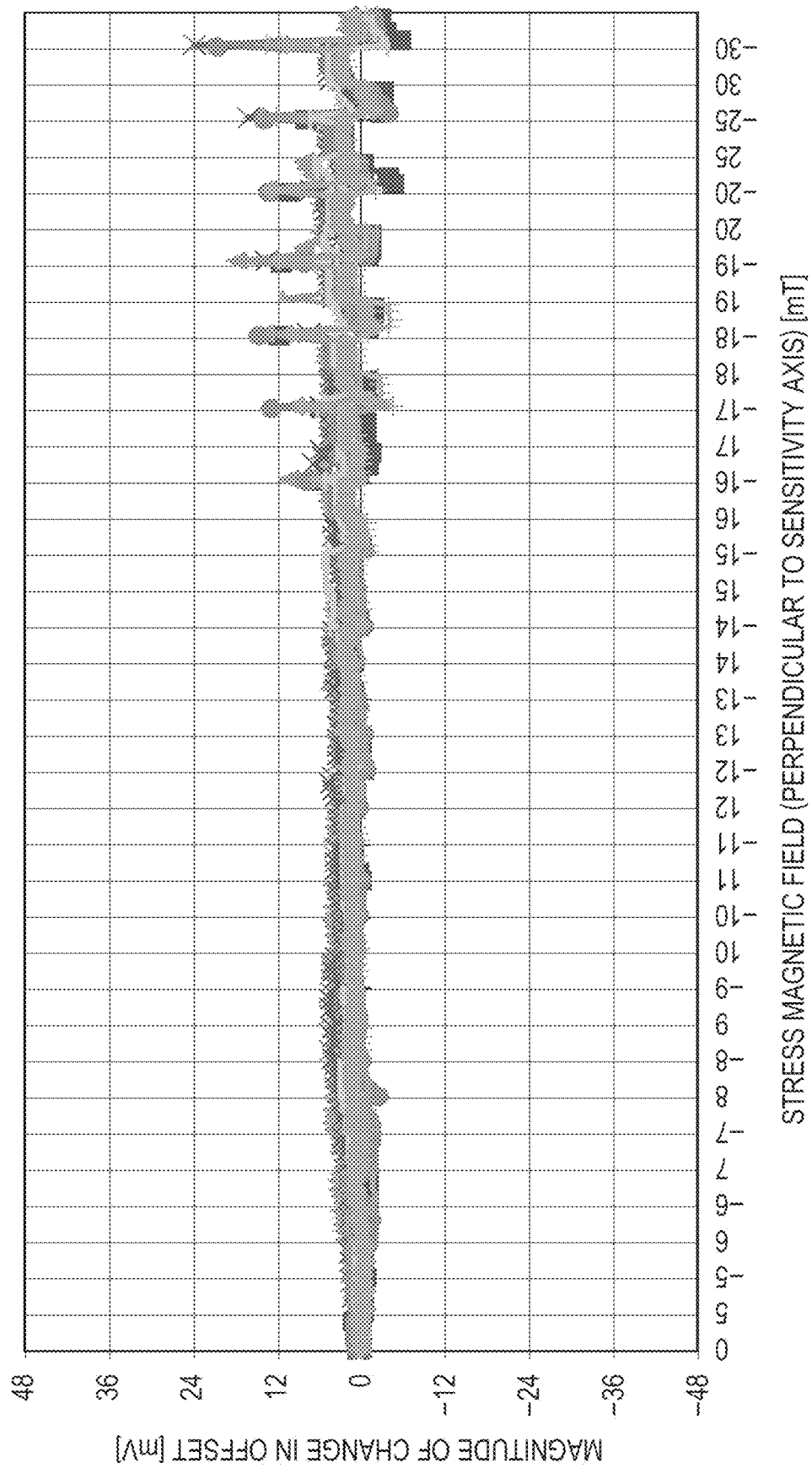
FIG. 17 is a graph showing a tolerance of a magnetic sensor to an external magnetic field according to Example 2.
Figure 18:
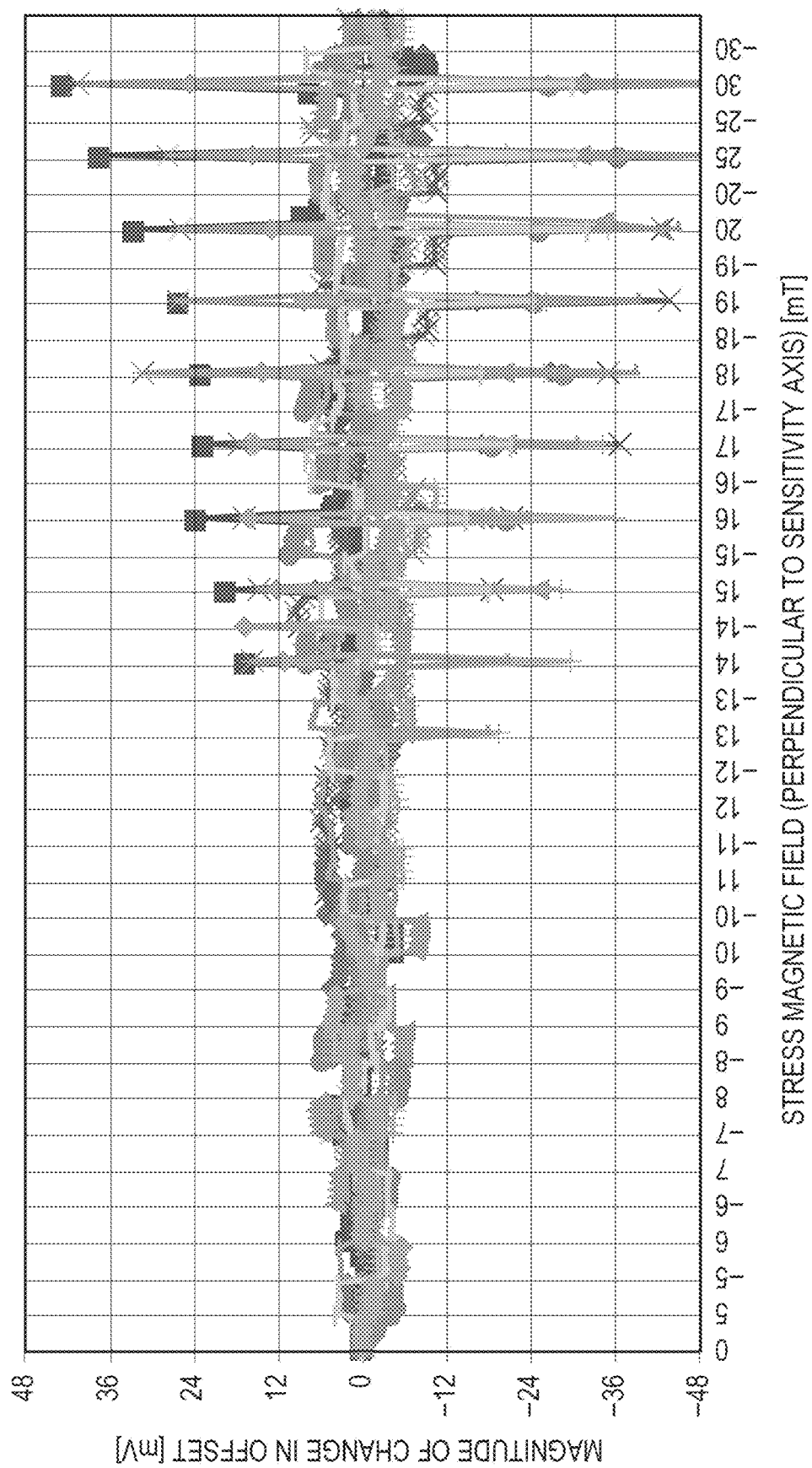
FIG. 18 is a graph showing the tolerance of a magnetic sensor to an external magnetic field according to Comparative Example 1.
Figure 19:
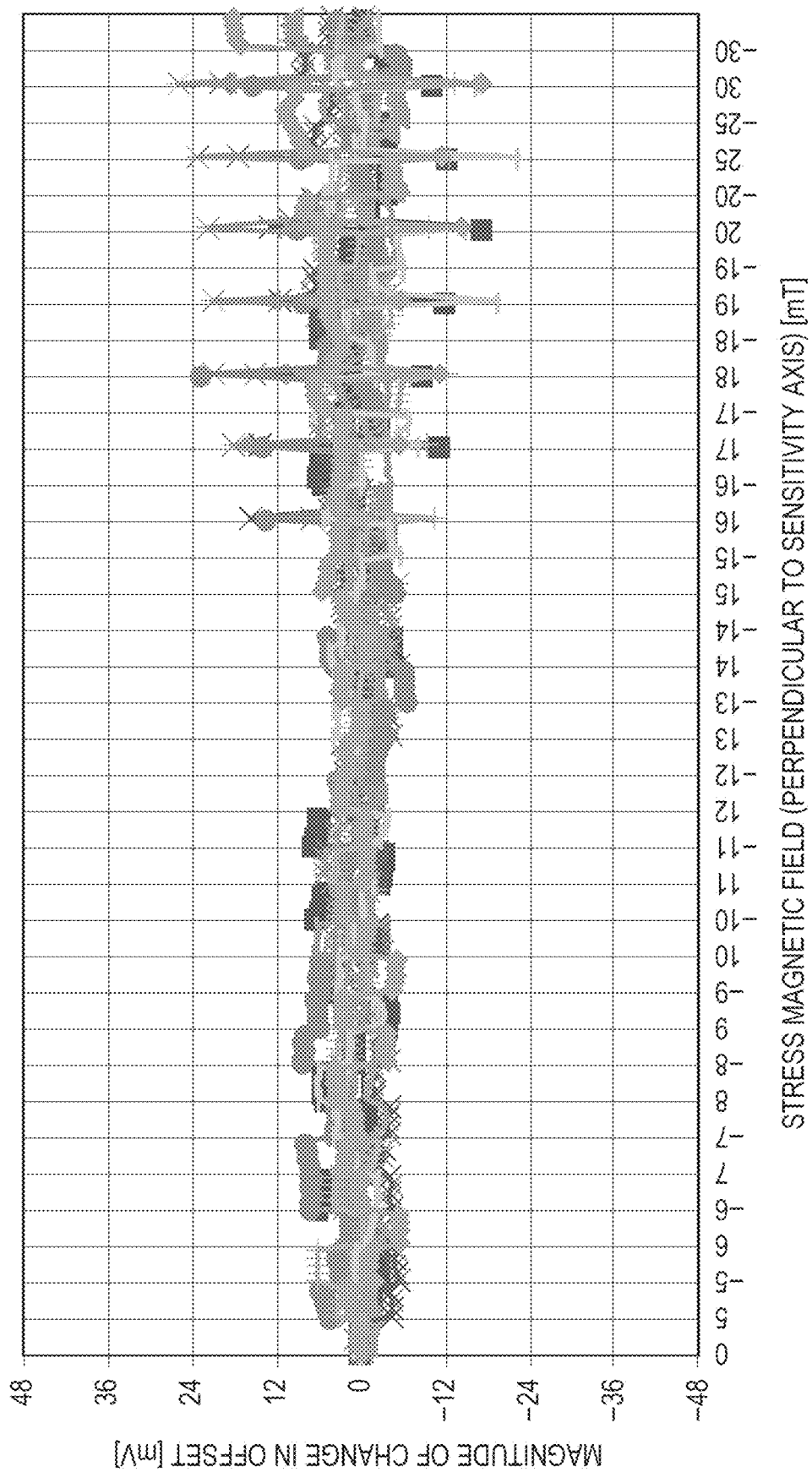
FIG. 19 is a graph showing a tolerance of a magnetic sensor to an external magnetic field according to Comparative Example 2.

FIGS. 16 and 17 are graphs showing the measurement results of the tolerance to the external magnetic field respectively for the magnetic sensors according to Examples 1 and 2 (where 10 samples were measured for each Example). FIGS. 18 and 19 are graphs showing the measurement results of the tolerance to the external magnetic field respectively for the magnetic sensors according to Comparative Examples 1 and 2 (where 10 samples were measured for each Comparative Example).

As shown in FIG. 16, in the magnetic sensor according to Example 1, no offset occurred up to an external magnetic field of ±25 mT. In the magnetic sensor according to Example 2, as shown in FIG. 17, offset occurred when an external magnetic field of ±16 mT was applied. However, the magnitude of change in offset was maintained small.

In comparison, as shown in FIG. 18, in the magnetic sensor according to Comparative Example 1, an offset occurred at an external magnetic field of ±13 mT, and the magnitude of change in offset was large. As shown in FIG. 19, by providing the magnetic absorption portion in the magnetic shield, a slight improvement was achieved in the tolerance to the external magnetic fields in the direction perpendicular to the sensitivity axis. However, an offset occurred for a smaller external magnetic field than in Example 1, and a greater change in offset occurred than in Example 1 and Example 2.

From the results shown in FIGS. 16 to 19, it can be seen that the tolerance of the magnetic sensor to the perpendicular magnetic field can be improved by providing the second shield parts on either side in the longitudinal direction of the first second shield part such that the second shield parts provide covering in the direction perpendicular to the sensitivity axis of the magnetoresistive elements. In particular, by combining with the magnetic balance coil having the shape of character of 8 including the first coil and the second coil arranged, as viewed in the thickness direction, line-symmetrically, the magnetic sensor having good tolerance to the perpendicular magnetic field was achieved.

Measurement Example 3

Figure 12B:
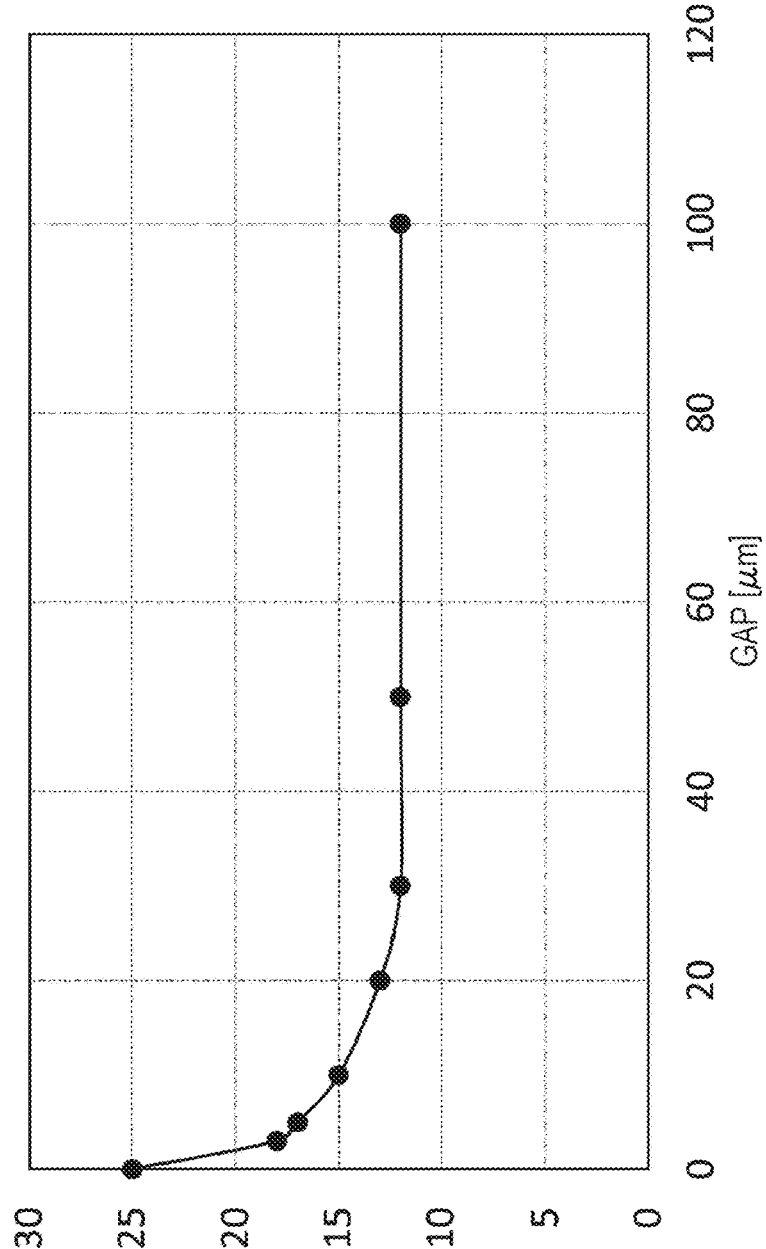
FIG. 12B is a graph showing the tolerance of the magnetic sensor to the external magnetic field for various sizes of the gap of the magnetic shield according to Example 3.

FIG. 12B is a graph showing the tolerance of the magnetic sensor to the external magnetic field for various sizes of the gap of the magnetic shield according to Example 3. More specifically, FIG. 12B shows the magnitude of the perpendicular magnetic field at which an offset occurred for various sizes of gaps of the magnetic shield. Note that the value for the gap size of 0 μm shown in FIG. 12B is that obtained for the magnetic shield 15 according to Example 1 shown in FIG. 11A. As shown in FIG. 12B, when the gap between the first shield part and the second shield part is set to be 20 μm or less, the tolerance to the perpendicular magnetic field can be improved.

The magnetic sensor having the magnetoresistive elements according to one embodiment of the present invention can be suitably used as a current sensor in a pole transformer in an infrastructure system, or as a current sensor for use in an electric vehicle, a hybrid vehicle, or the like.

What is claimed is:

1. A magnetic sensor for measuring a strength of a magnetic field to be measured, the magnetic sensor comprising:
    at least one magnetoresistive element disposed on an element formation plane, such that a sensitivity axis of the magnetoresistive element extends in a first direction along the element formation plane;
    a magnetic shield disposed over the magnetoresistive element so as to be apart from the magnetoresistive element in a normal direction perpendicular to the element formation plane; and
    a magnetic balance coil disposed between the magnetoresistive element and the magnetic shield in the normal direction, the strength of the magnetic field being measured based on a current flowing through the magnetic balance coil,
    wherein the magnetic shield includes:
        a first shield part extending in a second direction along the element formation plane, the second direction being perpendicular to the first direction and a longitudinal direction of the first shield part; and
        a pair of second shield parts provided on respective sides of the first shield part in the longitudinal direction,
    wherein the first shield part overlaps to cover the magnetoresistive element when viewed from the normal direction, while each of the pair of second shield parts overlaps to cover the magnetoresistive element when viewed from the second direction, thereby providing a magnetic path for a magnetic field in the second direction from one of the second shield parts to the other of the second shield parts via the first shield part,
    wherein the magnetic balance coil includes a first coil and a second coil, each of the first coil and the second coil including:
        a parallel portion extending parallel to the second direction; and
        a crossing portion extending from the parallel portion in a direction crossing the second direction, when viewed from the normal direction,
    wherein the first coil and the second coil are disposed adjacent to each other, symmetrically with respect to a line extending in the second direction and passing through the magnetoresistive element, when viewed from the normal direction, thereby forming an adjacent portion including the parallel portion of the first coil and the parallel portion of the second coil adjacent to each other,
    and wherein the first shield part overlaps the adjacent portion and covers the magnetoresistive element, but does not overlap the crossing portion, while each of the second shield parts is disposed between the crossing portion of the first coil and the crossing portion of the second coil, when viewed from the normal direction.

2. The magnetic sensor according to claim 1, wherein the first shield part and the respective second shield part are magnetically coupled to each other via a gap provided therebetween.

3. The magnetic sensor according to claim 2, wherein a distance between the first shield part and the respective second shield parts are equal to or smaller than 20 μm.

4. The magnetic sensor according to claim 1, wherein the at least one magnetoresistive element includes:
    a plurality of the magnetoresistive elements arranged along the second direction, such that the line extending in the second direction passes through the plurality of magnetoresistive elements.

5. The magnetic sensor according to claim 1, wherein the first shield part and the respective second shield part are connected to each other.

6. The magnetic sensor according to claim 1,
    wherein each of the second shield parts has a connection end connected to the first shield part and a non-connection end opposite to the connection end,
    and wherein a distance between the magnetoresistive element and the non-connecting end is greater than a distance between the magnetoresistive element and the connecting end, viewed from the normal direction.

7. A current sensor comprising:
    the magnetic sensor according to claim 1,
    wherein the magnetic field to be measured by the magnetic sensor is an induced magnetic field generated by a current to be measured.

* * * * *